(12) United States Patent
Paek et al.

(10) Patent No.: US 11,696,489 B2
(45) Date of Patent: Jul. 4, 2023

(54) FLEXIBLE DISPLAY APPARATUS WITH CURVED EDGE AND ELECTRONIC DEVICE COMPRISING THE SAME

(71) Applicant: LG Display Co., Ltd., Seoul (KR)

(72) Inventors: SeungHan Paek, Paju-si (KR); Seongwoo Park, Paju-si (KR); Saemleenuri Lee, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 120 days.

(21) Appl. No.: 16/655,897

(22) Filed: Oct. 17, 2019

(65) Prior Publication Data
US 2020/0136069 A1    Apr. 30, 2020

(30) Foreign Application Priority Data
Oct. 31, 2018  (KR) .......................... 10-2018-0132455

(51) Int. Cl.
*H01L 29/08* (2006.01)
*H01L 35/24* (2006.01)
(Continued)

(52) U.S. Cl.
CPC .............. *H10K 77/111* (2023.02); *B32B 3/28* (2013.01); *B32B 17/06* (2013.01); *C03C 15/00* (2013.01);
(Continued)

(58) Field of Classification Search
CPC ............ H01L 51/0097; H01L 27/3244; H01L 51/524; H01L 51/529; H01L 2251/5338; B32B 3/28; B32B 17/06; B32B 2457/20; B32B 2315/08; B32B 27/365; B32B 3/02; B32B 5/18; B32B 3/08; B32B 3/30; B32B 27/36; B32B 27/06; B32B 27/281; B32B 7/12; B32B 15/046; B32B 27/325; B32B 27/286; B32B 2255/06; B32B 2307/546; B32B 2307/7244; B32B 2307/302; B32B 2255/20; B32B 2307/51; B32B 2307/42; B32B 2307/7265; B32B 2255/28; B32B 2307/41; B32B 2307/732; B32B 2307/558; B32B 2307/706; B32B 2255/26; B32B 2307/402; B32B 2307/418;
(Continued)

(56) References Cited

U.S. PATENT DOCUMENTS 9,048,443 B2    6/2015  Namkung et al.
9,485,858 B2   11/2016  Namkung et al.
(Continued)

FOREIGN PATENT DOCUMENTS

CN    105814523 A    7/2016
CN    106250800 A   12/2016
(Continued)

OTHER PUBLICATIONS

Office Action dated Jun. 9, 2021, issued in corresponding Chinese Patent Application No. 201910860642.1.

*Primary Examiner* — Ismail A Muse
(74) *Attorney, Agent, or Firm* — Morgan, Lewis & Bockius LLP

(57) ABSTRACT

A flexible display apparatus comprises a glass substrate including a flat surface and a glass etching surface that is curved, and a flexible display panel including a bending portion on the glass etching surface.

28 Claims, 16 Drawing Sheets

(51) Int. Cl.
*H01L 51/00* (2006.01)
*H10K 77/10* (2023.01)
*B32B 3/28* (2006.01)
*C03C 15/00* (2006.01)
*B32B 17/06* (2006.01)
*H10K 50/87* (2023.01)
*H10K 50/84* (2023.01)
*H10K 59/12* (2023.01)
*H10K 102/00* (2023.01)

(52) U.S. Cl.
CPC .......... *H10K 50/841* (2023.02); *H10K 50/87* (2023.02); *H10K 59/12* (2023.02); *B32B 2315/08* (2013.01); *B32B 2457/20* (2013.01); *H10K 2102/311* (2023.02)

(58) Field of Classification Search
CPC .......... B32B 2255/24; B32B 2307/204; B32B 15/20; B32B 27/285; C03C 15/00; C03C 2218/34; Y02E 10/549; G09F 9/301; G02F 1/133308; G02F 1/133305; G02F 1/133331
See application file for complete search history.

(56) References Cited

U.S. PATENT DOCUMENTS

| | | | |
|---|---|---|---|
| 9,568,800 | B1 | 2/2017 | Sprague |
| 2015/0014644 | A1 | 1/2015 | Namkung et al. |
| 2015/0146386 | A1 | 5/2015 | Namkung et al. |
| 2015/0153862 | A1* | 6/2015 | Nakamura ............ G06F 3/041 345/173 |
| 2016/0116941 | A1 | 4/2016 | Kuwabara et al. |
| 2016/0357294 | A1 | 12/2016 | Ozeki et al. |
| 2017/0077439 | A1 | 3/2017 | Lee et al. |
| 2017/0094039 | A1* | 3/2017 | Lu ...................... H04M 1/185 |
| 2017/0118849 | A1 | 4/2017 | Kim et al. |
| 2017/0179423 | A1 | 6/2017 | Kwon et al. |
| 2018/0024594 | A1* | 1/2018 | Park ..................... B32B 7/12 156/60 |
| 2019/0056812 | A1* | 2/2019 | Wang ................. G06F 3/0443 |
| 2020/0209925 | A1* | 7/2020 | Paek ................ G02F 1/133305 |
| 2021/0070030 | A1* | 3/2021 | Bae ................... B32B 43/006 |
| 2021/0104582 | A1* | 4/2021 | Kim .................... H01L 27/3225 |

FOREIGN PATENT DOCUMENTS

| | | |
|---|---|---|
| CN | 106887186 A | 6/2017 |
| CN | 206400960 U | 8/2017 |
| KR | 10-2015-0007632 A | 1/2015 |
| KR | 10-2015-0062237 A | 6/2015 |

* cited by examiner

FLEXIBLE DISPLAY APPARATUS WITH CURVED EDGE AND ELECTRONIC DEVICE COMPRISING THE SAME

CROSS-REFERENCE TO RELATED APPLICATIONS

This application claims the benefit of the Korean Patent Application No. 10-2018-0132455 filed on Oct. 31, 2018, which is hereby incorporated by reference as if fully set forth herein.

BACKGROUND

Technical Field

The present disclosure relates to a flexible display apparatus and an electronic device comprising the same.

Description of the Related Art

Generally, a display apparatus is widely used as a display screen of various electronic devices, such as a mobile communication terminal, an electronic diary, an electronic book, a portable multimedia player (PMP), a navigator, an Ultra Mobile PC (UMPC), a mobile phone, a smart phone, a tablet personal computer (PC), a watch phone, an electronic pad, a wearable device, a portable information device, a vehicle control display device, a television, a notebook computer, and a monitor.

Because each of a liquid crystal display apparatus, a light emitting display apparatus, and an electrophoresis display apparatus is able to have a thin profile, studies and development for making them flexible are ongoing. In a flexible display apparatus, a display portion includes a thin film transistor and lines are formed on a flexible substrate. Because the flexible display apparatus may be able to display an image even though it is bent like a paper, the flexible display apparatus may be used for display various fields.

Recently, studies and development are ongoing for a display apparatus that may embody an increased and/or maximized screen by reducing a bezel area where an image is not displayed in the display panel.

SUMMARY

The inventors of the present disclosure have recognized that a manufacturing cost is increased due to use of expensive laser equipment, and due to a laser release related defect (particles or transfer according to surface roughness of a flexible substrate) that is generated in manufacturing a flexible display panel by detaching a carrier glass from the flexible substrate through a laser release process. After a manufacturing process of the flexible display panel is completed in such a manner that the laser sacrificial layer and the flexible substrate are sequentially formed on the carrier glass, the laser release process irradiates laser to a laser sacrificial layer. Also, the inventors of the present disclosure have recognized that bending reliability of the flexible display panel may be deteriorated due to bending stress applied to a bending area of the flexible display panel by a rear protective film (or back plate) as the rear protective film is attached onto a rear surface of the flexible substrate. In this respect, the inventors of the present disclosure have studied technologies that may replace the laser release process, and have invented a flexible display apparatus of a new structure, in which reliability is improved and a width of a bezel area may be reduced and/or minimized while increasing bending reliability of the flexible display panel.

Accordingly, the present disclosure is directed to a flexible display apparatus and an electronic device comprising the same that substantially obviate one or more of the problems due to limitations and disadvantages of the related art.

An aspect of the present disclosure is to provide a flexible display apparatus and an electronic device comprising the same in which reliability is improved and a width of a bezel area may be reduced and/or minimized.

Additional features and advantages of the disclosure will be set forth in the description which follows, and in part will be apparent from the description, or may be learned by practice of the disclosure. The objectives and other advantages of the disclosure will be realized and attained by the structure particularly pointed out in the written description and claims hereof as well as the appended drawings.

In accordance with an aspect of the present disclosure, a flexible display apparatus comprises a glass substrate including a flat surface and a glass etching surface that is curved; and a flexible display panel including a bending portion on the glass etching surface.

In accordance with another aspect of the present disclosure, ann electronic device comprises a cover window having a front window and a bending window bent from the front window in a curved shape; a display module coupled to the cover window; and a housing that stores the display module and supports the cover window, wherein the display module includes: a flexible display panel including a display portion having a plane display portion coupled with the front window and a bending display portion coupled with the bending window; a glass substrate having a flat surface supporting the plane display portion and a glass etching surface supporting the bending display portion; and a filling member supporting the bending display portion and covering the glass etching surface, wherein the glass etching surface has a non-flat structure in which the flat surface is partially removed.

The present disclosure may provide a flexible display apparatus and an electronic device comprising the same in which reliability is improved and a width of a bezel area may be reduced and/or minimized.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings.

DETAILED DESCRIPTION

Figure 1:
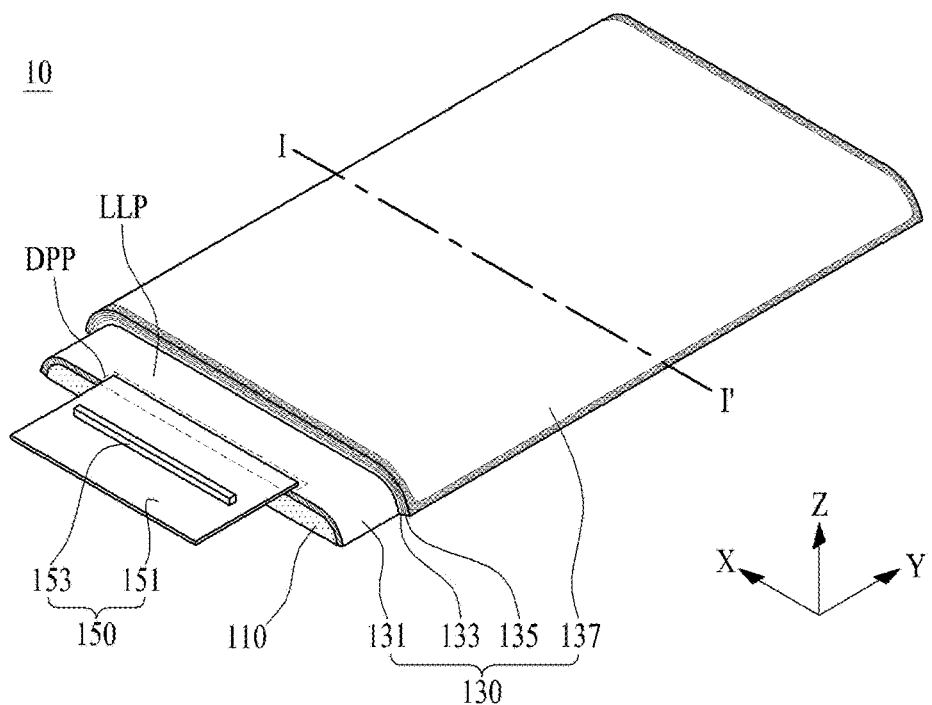
FIG. 1 is a perspective view illustrating a flexible display apparatus according to one embodiment of the present disclosure.

Reference will now be made in detail to some embodiments of the present disclosure, examples of which are illustrated in the accompanying drawings.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted.

In a case where "comprise," "have," and "include" described in the present specification are used, another part may be added unless "only~" is used. The terms of a singular form may include plural forms unless referred to the contrary.

In construing an element, the element is construed as including an error range although there is no explicit description.

In describing a position relationship, for example, when the position relationship is described as "upon~," "above~," "below~," and "next to~," one or more portions may be arranged between two other portions unless "just~" or "direct" is used.

In describing a time relationship, for example, when the temporal order is described as "after~," "subsequent~," "next~," and "before~," a case which is not continuous may be included unless "just" or "direct" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, a flexible display apparatus and an electronic device comprising the same according to the present disclosure will be described in detail with reference to the accompanying drawings. Wherever possible, the same reference numbers will be used throughout the drawings to refer to the same or like parts.

Figure 2:
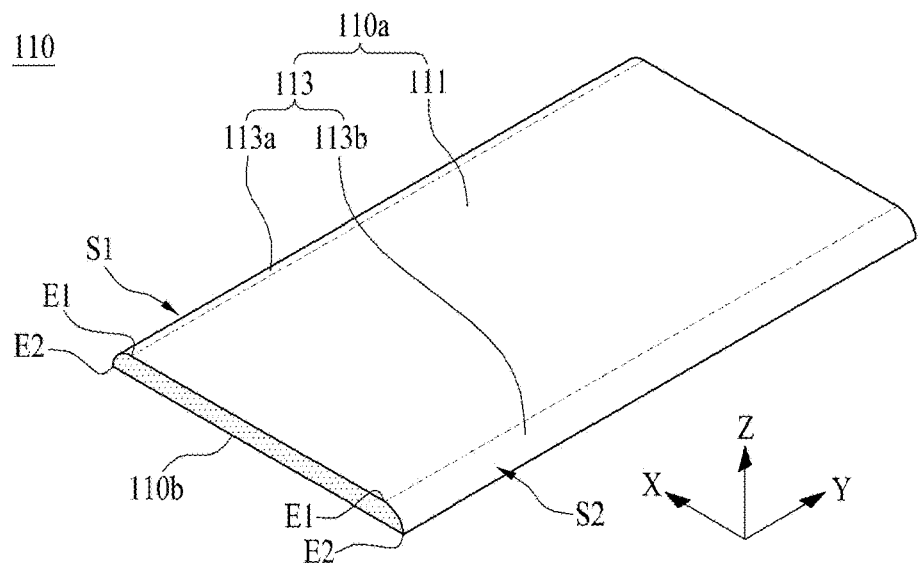
FIG. 2 is a perspective view illustrating a glass substrate shown in FIG. 1.
Figure 3:
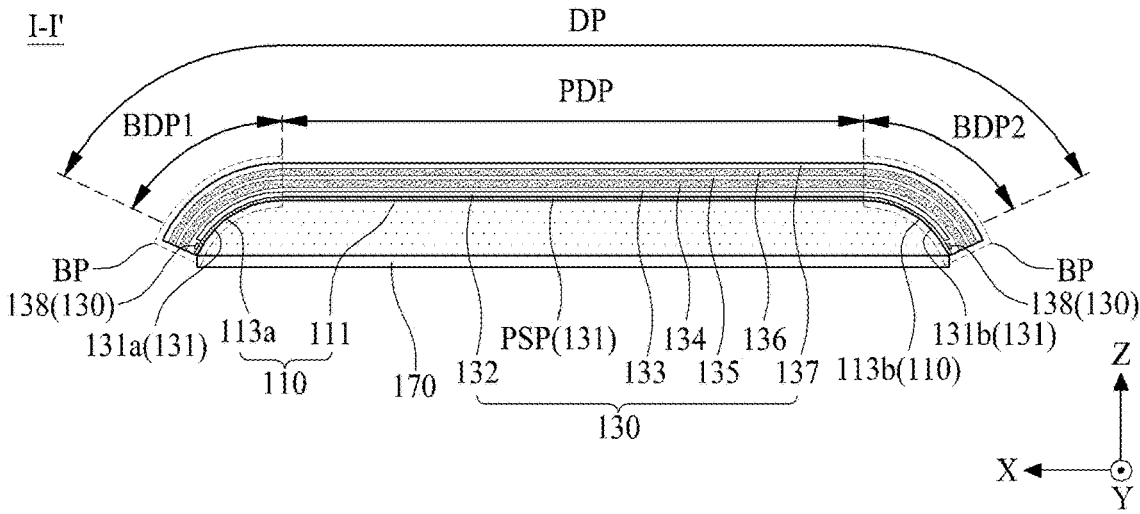
FIG. 3 is a cross-sectional view taken along line I-I' shown in FIG. 1.

FIG. 1 is a perspective view illustrating a flexible display apparatus according to one embodiment of the present disclosure, FIG. 2 is a perspective view illustrating a glass substrate shown in FIG. 1, and FIG. 3 is a cross-sectional view taken along line I-I' shown in FIG. 1.

With reference to FIGS. 1 to 3, the flexible display apparatus 10 according to one embodiment of the present disclosure may include a glass substrate 110 and a flexible display panel 130.

The glass substrate 110 is a base substrate or support substrate of the flexible display apparatus 10, and supports the flexible display panel 130.

The glass substrate 110 according to one embodiment may include, but not limited to, a soda-lime glass or a non-alkali glass. The glass substrate 110 may include a glass widely used to manufacture a flat display panel. Moreover, the glass substrate 110 may include any one or a deposited structure of sapphire glass and gorilla glass.

The glass substrate 110 according to one example may have a thickness of 0.01 mm to 1 mm to maintain flatness of the flexible display panel 130 and shield permeation of water or oxygen into the flexible display panel 130, but its thickness may be changed depending on a size of the display apparatus 10 without being limited to this example. The glass substrate 110 according to another example may have a thickness of 0.01 mm to 0.5 mm to be bent together with the flexible display panel 130 while shielding permeation of water or oxygen into the flexible display panel 130, but its thickness may be changed depending on a size of the display apparatus 10 without being limited to this example.

The glass substrate 110 according to one example may include a flat panel shape that includes a front surface 110a and a rear surface 110b. The front surface 110a of the glass substrate 110 supports a rear surface of the flexible display panel 130. The front surface 110a of the glass substrate 110 according to one example may include a flat surface 111, and a glass etching surface 113 of a non-flat structure, from which the flat surface 111 is partially removed.

The flat surface 111 may substantially have a plane structure. The flat surface 111 according to one example may be defined as the other portion except first and second edge portions parallel with a long side length direction Y (or first direction) of the glass substrate 110 of the front surface 110a of the glass substrate 110. The flat surface 111 may directly be coupled with the rear surface of the flexible display panel 130. In other words, the flat surface 111 may directly be coupled with the rear surface of the flexible display panel 130 without any adhesive member such as an adhesive.

The glass etching surface 113 may be formed on the other portion except the flat surface 111 of the front surface 110a of the glass substrate 110. The glass etching surface 113 according to the present disclosure may be formed in a convex section shape while having a non-flat structure as the flat surface 111 is partially removed (or etched) by a glass etching process with respect to the glass substrate 110 having a flat shape. That is, the glass etching surface 113 according to the present disclosure may have an inverse tapered shape that includes an undercut as the flat surface of each of the first and second edge portions of the glass substrate 110 is partially removed by the glass etching process. In this case, the undercut of the glass etching surface 113 may adjoin the flexible display panel 130. For example, the glass etching process may be a wet etching process using an etching solution containing hydrofluoric acid (HF).

As an example, the glass etching surface 113 is formed as edge portions between the front surface 110a and a side of the glass substrate 110 are partially removed, whereby the glass etching surface 113 may be defined as a non-orthogonal edge portion, a non-flat portion, a rounding portion having a convex curved shape, a spline curved portion having a plurality of inflection points, or an inverse tapered portion in accordance with its sectional shape. As another example, the glass etching surface 113 is formed to have a step difference from the flat surface 111 based on a thickness direction Z of the glass substrate 110, whereby the glass etching surface 113 may be defined as a step difference portion or a plurality of fine step difference portions in accordance with its sectional shape. As still another example, the glass etching surface 113 is formed between a front end E1 of the flat surface 111 and a rear end E2 of the glass substrate 110 in a non-vertical surface structure which is not parallel with a thickness direction Z of the glass substrate 110, whereby the glass etching surface 113 may be defined as an oblique slope, a curved slope or a step slope in accordance with its sectional shape. Because the glass etching surface 113 is indirectly coupled with the rear surface of the flexible display panel 130 by an adhesive member, such as an adhesive, without being directly coupled with the rear surface of the flexible display panel 130, the glass etching surface 113 may be defined as a panel support portion. As another example, because the glass etching surface 113 guides bending of the flexible display panel 130 bent in a curved shape, the glass etching surface 113 may be defined as a bending guide portion.

The glass etching surface 113 according to one example may include a first glass etching surface 113a (or first panel support portion) formed at the first edge portion (or a first periphery portion, for example, left edge portion) of the glass substrate 110, and a second glass etching surface 113b (or second panel support portion) formed at the second edge portion (or a second periphery portion, for example, right edge portion) parallel with the first edge portion of the glass substrate 110. In this case, because the first glass etching surface 113a is arranged between the front end E1 of the flat surface 111 and the rear end E2 of the glass substrate 110 around a short side length direction X of the glass substrate 110, the first glass etching surface 113a may be defined as a first side S1. Likewise, because the second glass etching surface 113b is arranged between the front end E1 of the flat surface 111 and the rear end E2 of the glass substrate 110 around a short side length direction X of the glass substrate 110, the second glass etching surface 113b may be defined as a second side S2.

The first glass etching surface 113a and the second glass etching surface 113b according to one example are formed by the glass etching process at the same time and therefore may have the same shape within an etching process error range.

The first glass etching surface 113a and the second glass etching surface 113b according to one example are formed by the glass etching process independently from each other and therefore may have their respective shapes different from each other.

The rear surface 110b of the glass substrate 110 may substantially have a plane structure. For example, because the rear surface 110b of the glass substrate 110 is protected by an etching mask during a glass etching process for forming the glass etching surface, the rear surface 110b is not etched by the glass etching process and, therefore, may substantially have a plane structure.

A non-edge structure or a curved shape may be provided between the rear surface 110b of the glass substrate 110 and the glass etching surface 113.

The flexible display panel 130 may include a bending portion BP arranged on the glass etching surface 113 of the glass substrate 110. For example, the flexible display panel 130 may include a bending portion BP arranged on the front surface 110a of the glass substrate 110 and bent in a curved shape along the glass etching surface 113 of the glass substrate 110.

The flexible display panel 130 according to one example may include a flexible substrate 131, a pixel array portion 132, an encapsulation portion 133, and a functional film 137.

The flexible substrate 131 may be defined as a base substrate of the flexible display panel 130. The flexible substrate 131 may include a flexible plastic material, for example, any one of PI(polyimide), PET(polyethyleneterephthalate), PC(polycarbonate), PES(polyethersulfone), PEN (polyethylenapthanate), PNB(polynorborneen), PMP (polymethylpentene), PMMA(poly methyl methacrylate), and COC(cycloolefin copolymer). In an example, the flexible substrate 131 may include an opaque or colored PI (polyimide). The flexible substrate 131 may be formed on the front surface 110a of the glass substrate 110 without a film attachment process such as an adhesive member. For example, the flexible substrate 131 may be hardened by a hardening process after being formed (or coated) on the entire front surface 110a of the flat type glass substrate 110 having no glass etching surface 113 at a certain thickness.

The flexible substrate 131 according to one example may include a plane support portion PSP and a bending support portion. The plane support portion PSP may directly be coupled with the flat surface 111 of the glass substrate 110. That is, the plane support portion PSP may directly be coupled with the flat surface 111 of the glass substrate 110 without an adhesive member, by being hardened by a hardening process after being formed on the entire front surface 110a of the flat type glass substrate 110 having no glass etching surface 113 at a certain thickness. Therefore, the plane support portion PSP may directly be formed on the flat surface 111 of the glass substrate 110 and therefore may substantially have a plane structure.

The bending support portion may be extended from the plane support portion PSP and bent in a curved shape and therefore may be arranged on the glass etching surface 113 of the glass substrate 110. The bending support portion may be defined as first and second edge portions of the flexible substrate 130 overlapped with the glass etching surface 113 while being parallel with a long side length direction Y of the flexible substrate 131. In this case, in a state that the flexible substrate 131 is unfolded in a plane state, an inner side portion of the bending support portion adjacent to the plane support portion PSP may be overlapped with the glass etching surface 113, and an outer side portion of the bending support portion which is not adjacent to the plane support portion PSP may be protruded to the outside of the glass etching surface 113. The bending support portion may be bent in a curved shape in accordance with a bending guide of the glass etching surface 113 during a bending process of the flexible display panel 130, and therefore may be attached to the glass etching surface 113 by an adhesive member such as an adhesive.

The bending support portion according to one example may include first and second bending support portions 131a and 131b.

The first bending support portion 131a may support the first glass etching surface 113a of the glass substrate 110. The first bending support portion 131a according to one example may be attached to the first glass etching surface 113a by the adhesive member. In this case, the adhesive member may be interposed between the first glass etching surface 113a and the first bending support portion 131a to prevent damage to the second bending support portion 131b, such as a dent caused by an irregular surface structure of the first glass etching surface 113a, from occurring due to the glass etching process.

The second bending support portion 131b may support the second glass etching surface 113b of the glass substrate 110. The second bending support portion 131b according to one example may be attached to the second glass etching surface 113b by the adhesive member. In this case, the adhesive member may be interposed between the second glass etching surface 113b and the first bending support portion 131a to prevent damage to the second bending support portion 131b, such as a dent caused by an irregular surface structure of the second glass etching surface 113b, from occurring due to the glass etching process.

The pixel array portion 132 may be arranged on the flexible substrate 131 to display an image. The pixel array portion 132 according to one example may include a display portion DP having a plane display portion PDP and a bending display portion (or curved display portion), and a non-display portion surrounding the display portion DP.

The plane display portion PDP may be arranged on the plane support portion PSP of the flexible substrate 131. The plane display portion PDP may be arranged on the plane support portion PSP of the flexible substrate 131 coupled to the flat surface 111 of the glass substrate 110 to display an image in a substantially plane state which is not bent. The plane display portion PDP may be defined as a main display portion or a center display portion, which displays an image of the other center portion except the first and second edge portions among full images displayed on the flexible display panel 130.

The bending display portion may be arranged on the bending support portion of the flexible substrate 131. The bending display portion may be arranged on the bending support portion of the flexible substrate 131 attached to the glass etching surface 113 of the glass substrate 110 in a curved shape to display an image in a state bent in a curved shape. The bending display portion according to one example may be defined as an edge display portion for displaying images of the first and second edge portions, wherein the images are continuous with the image displayed on the plane display portion PDP among the full images displayed on the flexible display panel 130, without buffering. The bending display portion according to another example may be defined as an edge display portion for displaying an independent edge image different from the image displayed on the plane display portion PDP.

The bending display portion according to one example may include a first bending display portion BDP1 and a second bending display portion BDP2.

The first bending display portion BDP1 may be arranged on the first bending support portion 131a of the flexible substrate 131. The first bending display portion BDP1 may display an image of the first edge portion continuous with one side of the image displayed on the plane display portion PDP among the full images displayed on the flexible display panel 130, or may display a separate edge image. The first bending display portion BDP1 may be expressed as a first edge display portion, a first curved surface display portion, or a first active bending display portion.

The second bending display portion BDP2 may be arranged on the second bending support portion 131b of the flexible substrate 131. The second bending display portion BDP2 may display an image of the second edge portion continuous with the other side of the image displayed on the plane display portion PDP among the full images displayed on the flexible display panel 130, or may display a separate edge image. The second bending display portion BDP2 may be expressed as a second edge display portion, a second curved surface display portion, or a second active bending display portion.

The non-display portion may be formed at the edge portions of the flexible substrate 131 to surround the display portion DP. The non-display portion may be defined as a bezel area of the flexible display panel 130.

The pixel array portion 132 may include a plurality of pixels provided in a pixel area defined by signal lines provided on the flexible substrate 131, displaying images in accordance with signals supplied to signal lines. Each of the plurality of pixels may include a pixel circuit layer including a driving thin film transistor provided in the pixel area, an anode electrode electrically connected with the driving thin film transistor, a light emitting diode layer formed on the anode electrode, and a cathode electrode electrically connected with the light emitting diode layer.

The driving thin film transistor is provided in a transistor area of each pixel area defined on the flexible substrate 131, and may include a gate electrode, a gate insulating film, a semiconductor layer, a source electrode, and a drain electrode. In this case, the semiconductor layer of the thin film transistor may include a silicon such as a-Si, poly-Si, or low temperature poly-Si, or may include an oxide such as IGZO(Indium-Gallium-Zinc-Oxide).

The anode electrode is provided in an opening area defined in each pixel area in a pattern shape, and electrically connected with the driving thin film transistor.

The light emitting diode layer according to one example may include an organic light emitting diode layer formed with the anode electrode. The organic light emitting diode layer may be formed in a structure in which a hole injecting layer, a hole transporting layer, an organic light emitting layer, an electron transporting layer, and an electron injecting layer are deposited in due order. In this case, one or two or more of the hole injecting layer, the hole transporting layer, the electron transporting layer and the electron injecting layer may be omitted. The organic light emitting layer may be formed to emit light of the same color per pixel, for example, white light, or may be formed to emit light of a color different per pixel, for example, red light, green light or blue light.

The light emitting diode layer according to one example may include a micro light emitting diode element electrically connected with each of the anode electrode and the cathode electrode. The micro light emitting diode element is a light emitting diode embodied in the form of an integrated circuit (IC) or chip, and may include a first terminal electrically connected with the anode electrode and a second terminal electrically connected with the cathode electrode.

The cathode electrode may commonly be connected with the light emitting diode layers provided in the respective pixel areas.

The encapsulation portion 133 may be formed on the flexible substrate 131 to surround the pixel array portion 132, thereby preventing oxygen or water from being permeated into the light emitting diode layer of the pixel array portion 132. The encapsulation portion 133 according to one example may be formed in a multi-layered structure in which an organic material layer and an inorganic material layer are alternately deposited. In this case, the inorganic material layer may serve to shield oxygen or water from being permeated into the light emitting diode layer of the pixel array portion 132. The organic material layer may be formed to be relatively thicker than the inorganic material layer to cover particles that may be generated during a manufacturing process. For example, the encapsulation portion 133 may include a first inorganic film, an organic film on the first inorganic film, and a second inorganic film on the organic film. In this case, the organic film may be defined as a particle cover layer.

The functional film 137 may be attached onto the encapsulation portion 133 by a film adhesive member 136. In this case, the film adhesive member 136 may include a pressure sensitive adhesive (PSA), an optically clear adhesive (OCA), or an optically clear resin (OCR).

The functional film 137 according to one example may include an anti-reflection layer (or anti-reflection film) for improving outdoor visibility and contrast ratio for an image displayed on the flexible display panel 130 by preventing reflection of external light. For example, the anti-reflection layer may include a circular polarizing layer (or circular polarizing film) that shields reflective light reflected by a thin film transistor and/or lines arranged on the pixel array portion 132 from progressing to the outside.

The functional film 137 may further include a barrier layer (or barrier film) for primarily preventing water or oxygen permeation, wherein the barrier layer may be made of a material having low water permeability, for example, polymer material.

Also, the functional film 137 may further include a light path controlling layer (or light path controlling film) for controlling a path of light emitted from the pixel array portion 132 to the outside. The light path controlling layer may include a structure that a high refractive layer and a low refractive layer are deposited alternately, whereby a path of light incident from the pixel array portion 132 may be changed to reduce and/or minimize color shifting according to a viewing angle.

Optionally, the encapsulation portion 133 may be changed to a face seal surrounding the pixel array portion 132. In this case, the functional film 137 may be coupled with the pixel array portion 132 by the face seal.

The flexible display panel 130 according to one example may further include a touch electrode portion 135. The touch electrode portion 135 serves as a touch sensor arranged on the encapsulation portion 133, to sense a user's touch. In this case, the functional film 137 may be attached to the touch electrode portion 135 by the film adhesive member 136.

The touch electrode portion 135 according to one example may include a touch electrode layer arranged on the encapsulation portion 133 overlapped with the pixel array portion 132, and a dielectric layer covering the touch electrode layer. Optionally, the touch electrode portion 135 may be formed on a touch buffer layer covering the encapsulation portion 133. The touch electrode layer may include a plurality of touch driving electrodes arranged on the encapsulation portion 133 and overlapped with the pixel array portion 132 at constant intervals, and a plurality of touch sensing electrodes electrically insulated from the plurality of touch driving electrodes. The touch sensing electrodes may be arranged on the same layer as the touch driving electrodes, or may be arranged on respective layers different from each other by interposing the dielectric layer there between.

The touch electrode portion 135 according to another example may be replaced with a capacitance type touch panel as known in the art. In this case, the touch panel may be attached onto the encapsulation portion 133 by a transparent adhesive member 134. In this case, the transparent adhesive member 134 may include a pressure sensitive adhesive (PSA), an optically clear adhesive (OCA), or an optically clear resin (OCR).

Optionally, the touch electrode portion 135 may be arranged on the functional film 137. In this case, the functional film 137 may be arranged between the touch electrode portion 135 and the encapsulation portion 133.

The flexible display panel 130 according to one example may further include a display pad portion DPP, a gate driving circuit portion 138, and a link line portion LLP.

The display pad portion DPP may include a plurality of pad electrodes provided at a third edge portion (or a third periphery portion, for example, upper edge portion or lower edge portion) of the flexible substrate 131 spaced far apart from the pixel array portion 132.

The gate driving circuit portion 138 may be formed on the first and/or second edge portion of the flexible substrate 131 and connect with one end and/or the other end of each of a plurality of gate lines. The gate driving circuit portion 138 generates a gate signal in response to a gate control signal supplied through the display pad portion DPP and supplies the generated gate signal to each of the plurality of gate lines. The gate driving circuit portion 138 may be, but is not limited to, a gate built-in circuit formed together with the manufacturing process of the thin film transistor of the pixel.

The link line portion LLP may be arranged on the flexible substrate 131 between the display pad portion DPP and the pixel array portion 132. The link line portion LLP according to one example may include a plurality of data pad electrodes arranged in the display pad portion DPP, a plurality of data link lines connected with signal lines arranged in the pixel array portion 132 one to one, and a plurality of gate link lines connected with a plurality of gate pad electrodes arranged in the display pad portion DPP and the gate driving circuit portion 138.

The flexible display apparatus 10 according to one embodiment of the present disclosure may further include a panel driving circuit portion 150.

The panel driving circuit portion 150 is connected with the display pad portion DPP provided in the flexible substrate 131 and supplies a signal for displaying an image on the display portion DP of the pixel array portion 132 to the display pad portion DPP. The panel driving circuit portion 150 according to one example may include a flexible circuit film 151 and a driving integrated circuit 153.

The flexible circuit film 151 may be attached to the display pad portion DPP of the flexible substrate 131 through a film attachment process using an anisotropic conductive film. The flexible circuit film 151 may be bent toward the rear surface 110b of the glass substrate 110 to surround the side of the flexible substrate 131 and the side of the glass substrate 110.

The driving integrated circuit 153 may be packaged in the flexible circuit film 151 by a chip bonding process or a surface packaging process. The driving integrated circuit 153 generates a data signal and a gate control signal based on a timing synchronizing signal and image data supplied from an external display driving system, supplies the data signal to the data line of each pixel through the display pad portion DPP, and supplies the gate control signal to the gate driving circuit portion 138. The driving integrated circuit 153 may be arranged on one side of the flexible circuit film 151 bent toward the rear surface 110b of the glass substrate 110.

Optionally, the driving integrated circuit 153 may be packaged (or bonded) in a chip packaging area defined in the flexible substrate 131 without being packaged in the flexible circuit film 151, and electrically connected with the display pad portion DPP and respectively connected with signal lines of the pixel array portion 132 and the gate driving circuit portion 138 arranged on the flexible substrate 131. In this case, the flexible circuit film 151 serves to relay signal transmission between the display pad portion DPP and the display driving system.

The flexible display apparatus 10 according to one embodiment of the present disclosure may further include a radiation member 170 attached to the rear surface 110b of the glass substrate 110.

The radiation member 170 is attached to the rear surface 110b of the glass substrate 110 to radiate heat generated in accordance with driving of the flexible display panel 130. The radiation member 170 may be defined as a radiation tape, a radiation cushion tape, a conductive radiation tape, a radiation sheet, or a conductive radiation sheet.

The radiation member 170 according to one example may include a radiation layer, a cushion layer and an adhesive layer.

The radiation layer may include a material having relatively high heat conductivity. The radiation layer according to one example may include a metal layer such as Cu, and a graphite layer coated on the metal layer. The radiation layer may have a radiation function, a ground function and a function of protecting the rear surface of the flexible display apparatus 10.

The cushion layer (or buffer layer) may include a foam tape coupled to the radiation layer. The cushion layer may serve to attenuate impact.

The adhesive layer may be coupled with the cushion layer. The adhesive layer may include an uneven structure (or embossing structure) formed on a surface. The uneven structure of the adhesive layer is able to omit a process for removing bubbles generated between the rear surface 110b of the glass substrate 110 and the radiation member 170 by preventing bubbles from being generated between the rear surface 110b of the glass substrate 110 and the radiation member 170 during attachment between the rear surface 110b of the glass substrate 110 and the radiation member 170.

The flexible display apparatus 10 according to one embodiment of the present disclosure may have a reduced and/or minimum bezel area as the bending portion BP (or bending display portion) of the flexible display panel 130 is arranged to be bent in a curved shape on the glass etching surface 113 formed on the glass substrate 110 by the glass etching process. Also, in the present disclosure, the glass substrate 110 is not detached from the flexible substrate 131 after the manufacturing process of the flexible display panel 130 is completed, whereby a laser release process for detaching the glass substrate 110 from the flexible substrate 131 may be omitted. In the present disclosure, because the flexible display apparatus 10 may be manufactured even without using an expensive laser equipment, the manufacturing cost may be reduced, a defect (particles or transfer according to surface roughness of a flexible substrate) is not generated in accordance with the laser release process, and a rear protective film attached to the rear surface of the flexible substrate 131 may be omitted, whereby bending reliability of the flexibility substrate 131 may be improved.

Also, the flexible display apparatus 10 according to one embodiment of the present disclosure may improve reliability against water or oxygen by the glass substrate 110, as the flexible display panel 130 is directly coupled with the glass substrate 110.

Also, the flexible display apparatus 10 according to one embodiment of the present disclosure may enhance the radiation effect, because the heat conductivity of the glass substrate 110 directly coupled with the flexible display panel 130 is higher than that of the rear protective film (or back plate) attached to the rear surface of the flexible display panel of the related art by as much as two times. For example, the flexible display apparatus 10 according to one embodiment of the present disclosure may enhance the radiation effect as heat generated in accordance with driving of the flexible display panel 130 is radiated through the glass substrate 110. Moreover, heat generated in accordance with driving of the flexible display panel 130 may be radiated by being transferred to the radiation member 170 through the glass substrate 110, whereby the radiation effect may be more enhanced.

Figure 4A:
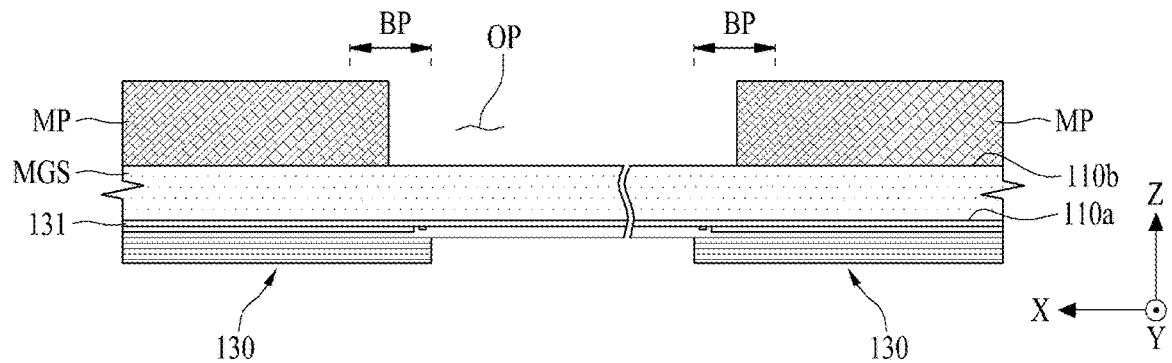
FIGS. 4A and 4B are cross-sectional views illustrating a manufacturing method of a glass etching surface in a flexible display apparatus according to one embodiment of the present disclosure.
Figure 4B:
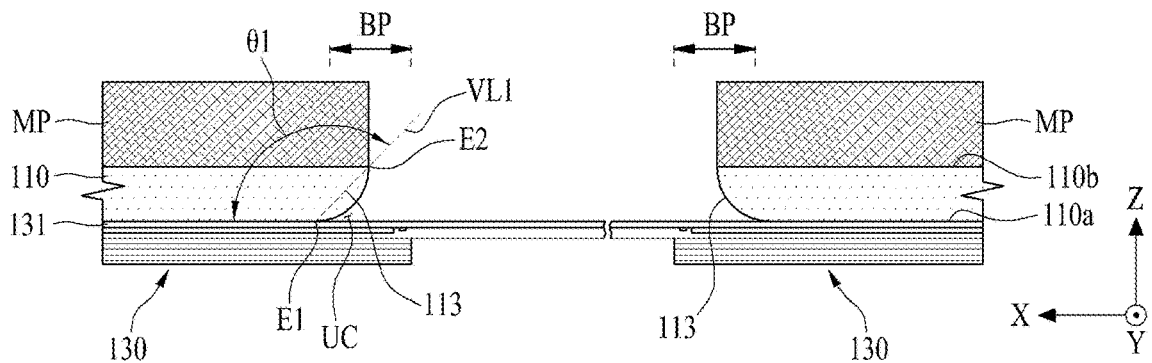

FIGS. 4A and 4B are cross-sectional views illustrating a manufacturing method of a glass etching surface in a flexible display apparatus according to one embodiment of the present disclosure. The manufacturing method of the glass etching surface 113 in the flexible display apparatus according to one embodiment of the present disclosure will be described with reference to FIGS. 4A and 4B.

With reference to FIG. 4A, after the flexible display panel 130 is formed on each of a plurality of panel areas defined on a front surface 110a of a mother glass substrate MGS, a glass etching mask pattern MP is formed on a rear surface 110b of the mother glass substrate MGS except at a predetermined glass etching area. In this case, the glass etching mask pattern MP may include an open portion OP corresponding to the bending portion BP of each of the plurality of display panels 130.

Then, as shown in FIG. 4B, a portion overlapped with the open portion OP of the glass etching mask pattern MP of the mother glass substrate MGS is removed by being etched through the glass etching process using the glass etching mask pattern MP as a mask, whereby the mother glass substrate MGS is divided into a plurality of glass substrates 110 overlapped with each of the plurality of flexible display panels 130, and a glass etching surface 113 is formed in each of the plurality of glass substrates 110 overlapped with the bending portion BP of each of the plurality of flexible display panels 130.

The glass etching surface 113 according to the present disclosure may serve to guide the bending portion BP of the flexible display panel 130 to be bent in a curved shape. Therefore, the glass etching process according to the present disclosure may be performed under an over etch condition to form the glass etching surface 113 having a convex section shape. In this case, the over etch condition may be defined as a glass etching process performed by exceeding a reference etching time set to etch the glass substrate of a certain thickness. If the glass etching process is performed in accordance with the over etch condition, the front surface 110a of the mother glass substrate MGS adjacent to the rear surface of the flexible display panel 130 is more etched than the rear surface 110b of the mother glass substrate MGS as the etching process time exceeds the reference etching time, whereby an undercut UC may be generated between the rear surface of the flexible substrate 131 of the flexible display panel 130 and the front surface 110a of the mother glass substrate MGS, and therefore, the glass etching surface 113 may have an inverse tapered shape. In this case, the undercut UC may be formed as the glass substrate 110 adjacent to the flexible substrate 131 is partially over-etched by the etching process time exceeding the reference etching time.

The glass etching surface 113 according to one example may have a convex shape between the front end E1 and the rear end E2 of the glass substrate 110 around a short side length direction X of the glass substrate 110. In this case, an angle θ1 between a first virtual line VL1 connecting the front end E1 of the glass substrate 110 with the rear end E2 of the glass substrate 110 and the front surface 110a of the glass substrate 110 may be an obtuse angle, for example, 100° to 150°. For example, the glass etching surface 113 may have a curved shaped section structure convex from the first virtual line VL1. The bending portion BP of the flexible display panel 130 may be bent toward the rear surface 110b from the front surface 110a of the glass substrate 110 at an angle less than 180° and therefore arranged on the glass etching surface 113 having an inverse tapered shape while including the undercut UC according to the over etch process. The glass etching surface 113 having an inverse tapered structure may be applied to the display apparatus in which the bending portion BP of the flexible display panel 130 is bent at an angle less than 180°.

Figure 5A:
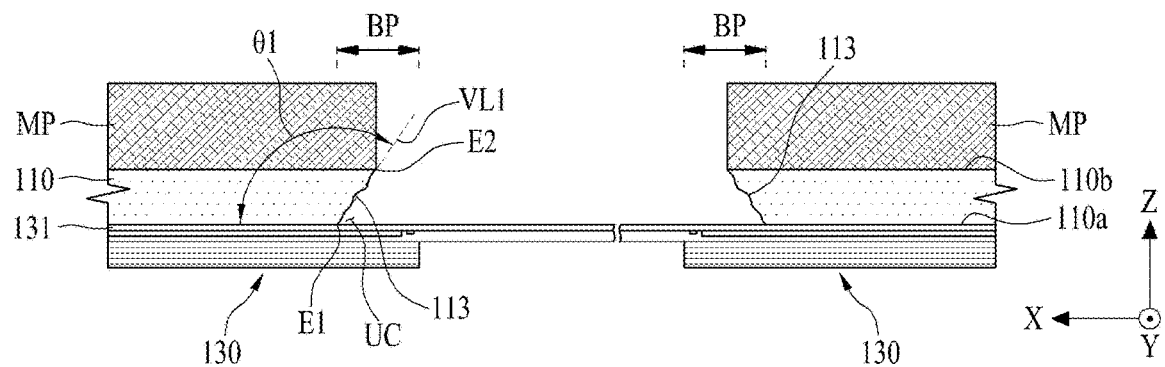
FIGS. 5A to 5C are cross-sectional views illustrating a sectional structure of a glass etching surface according to another embodiment of the present disclosure.
Figure 5B:
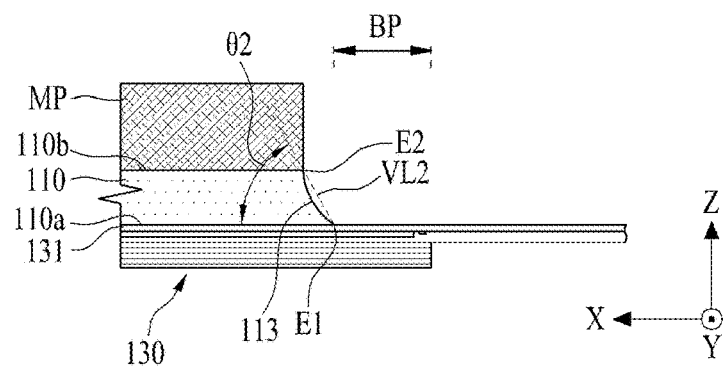
Figure 5C:
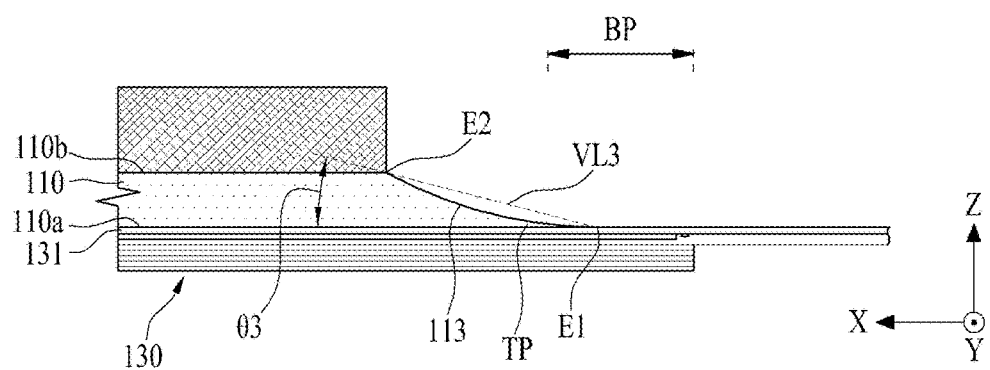

FIGS. 5A to 5C are cross-sectional views illustrating a sectional structure of a glass etching surface according to another embodiment of the present disclosure.

With reference to FIG. 5A, the glass etching surface 113 according to another embodiment of the present disclosure may have a spline curved shaped section structure between the front end E1 and the rear end E2 of the glass substrate 110 by the glass etching process according to the over etch condition. For example, the spline curved shape may include a plurality of inflection points located on the first virtual line VL1. Therefore, the glass etching surface 113 according to another embodiment of the present disclosure may have a spline curved shape including an undercut UC by the glass etching process according to the over etch condition.

With reference to FIG. 5B, the glass etching surface 113 according to still another embodiment may have a concave shaped forward tapered structure between the front end E1 and the rear end E2 of the glass substrate 110 by the glass etching process according to a just etch condition. In this case, the just etch condition may be defined as a glass etching process performed for a predetermined reference etching time to etch the glass substrate of a certain thickness. If the mother glass substrate MGS is etched through the just etch process, the glass etching surface 113 may have an oblique shape having no undercut or concave shaped forward tapered structure. In this case, an angle θ2 between a second virtual line VL2 connecting the front end E1 of the glass substrate 110 with the rear end E2 of the glass substrate 110 and the front surface 110a of the glass substrate 110 may be an acute angle, for example, 15° to 70°. The bending portion BP of the flexible display panel 130 may be bent toward the rear surface 110b from the front surface 110a of the glass substrate 110 at an angle less than 90° and therefore arranged on the glass etching surface 113 having a forward tapered structure according to the just etch process. The glass etching surface 113 having a forward tapered structure may be applied to the display apparatus in which the bending portion BP of the flexible display panel 130 is bent at an angle less than 90°.

With reference to FIG. 5C, the glass etching surface 113 according to still another embodiment of the present disclosure may have an oblique shaped forward tapered structure between the front end E1 and the rear end E2 of the glass substrate 110 by the glass etching process according to a soft etch condition. In this case, the soft etch condition may be defined as a glass etching process performed for a time less than a predetermined reference etching time to etch the glass substrate of a certain thickness. If the mother glass substrate MGS is etched through the soft etch process, the glass etching surface 113 may have an oblique shape, and especially may have a tail portion TP from which a portion of the glass substrate of an etching area is not removed completely. In this case, an angle θ3 between a third virtual line VL3 connecting the front end E1 of the glass substrate 110 with the rear end E2 of the glass substrate 110 and the front surface 110a of the glass substrate 110 may be less than 15°. The bending portion BP of the flexible display panel 130 may be bent toward the rear surface 110b from the front surface 110a of the glass substrate 110 at an angle less than 30° and therefore arranged on the glass etching surface 113 having a forward tapered structure less than 15° according to the soft etch process. The glass etching surface 113 having a forward tapered structure less than 15° may be applied to the display apparatus in which the bending portion BP of the flexible display panel 130 is bent at an angle less than 30°.

After the glass etching process, the flexible substrate 131 is cut along a scribing line set outside each of the plurality of flexible display panels 130 through a panel scribing process, whereby the plurality of flexible display panels 130 may be detached individually. Then, a panel driving circuit portion may be attached to a display pad portion of each of the plurality of flexible display panels 130.

Therefore, the glass etching surface 113 according to the present disclosure may have an inverse tapered structure or a forward tapered structure through the glass etching process to enable bending of the bending portion of the flexible display panel 130.

Figure 6:
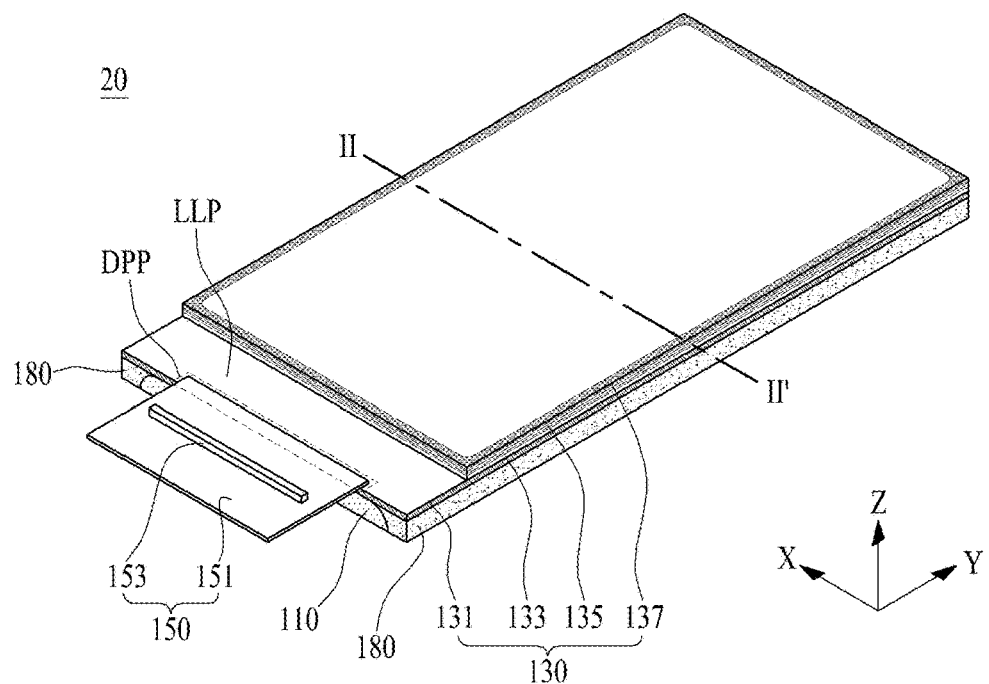
FIG. 6 is a perspective view illustrating a flexible display apparatus according to another embodiment of the present disclosure.
Figure 7:
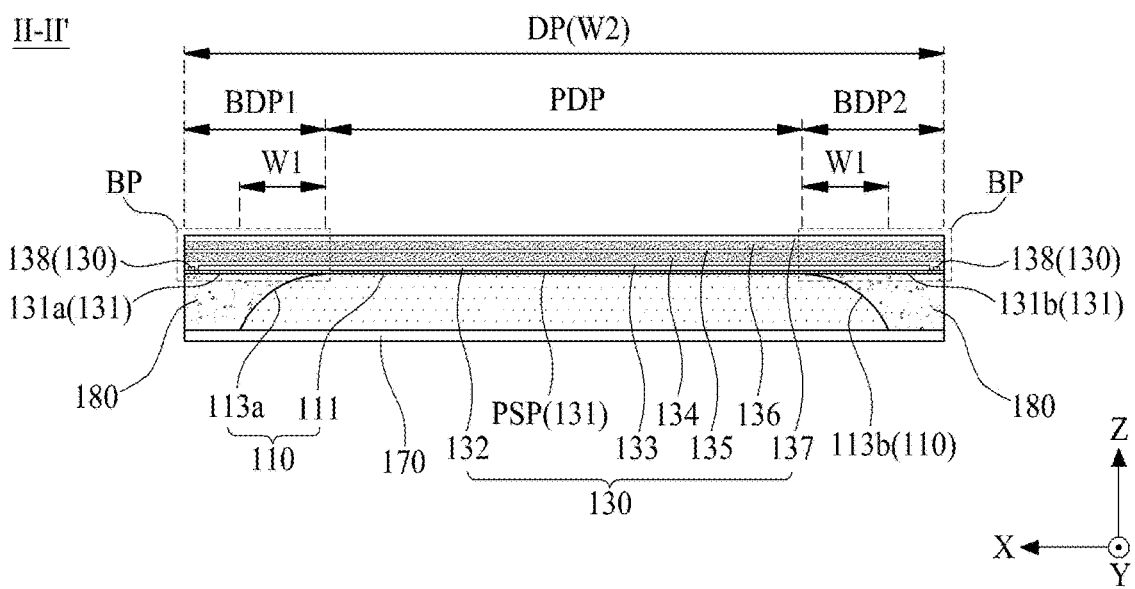
FIG. 7 is a cross-sectional view taken along line II-II' shown in FIG. 6.

FIG. 6 is a perspective view illustrating a flexible display apparatus according to another embodiment of the present disclosure, and FIG. 7 is a cross-sectional view taken along line II-II' shown in FIG. 6. In the flexible display apparatus of FIGS. 6 and 7, the adhesive member between the glass etching surface and the flexible display panel in the flexible display apparatus shown in FIGS. 1 to 5C is modified to be a filling member. Therefore, in the following description, repeated description of the other elements except the filling member and its related elements will be omitted or briefly made.

With reference to FIGS. 6 and 7, the flexible display apparatus 20 according to another embodiment of the present disclosure may further include a filling member 180 arranged between the glass etching surface 113 of the glass substrate 110 and the flexible display panel 130.

The filling member 180 may be formed to cover the glass etching surface 113, and may elastically support the bending portion BP of the flexible display panel 130 and may be bent in a curved shape together with the bending portion BP of the flexible display panel 130 that is bent in a curved shape. The filling member 180 may shield water or oxygen from permeating into the flexible display panel 130 through a boundary portion between the glass etching surface 113 and the flexible display panel 130. Also, the filling member 180 may enhance adhesion between the glass etching surface 113 and the bending portion BP of the flexible display panel 130. For example, the bending portion BP of the flexible display panel 130 may be attached (or coupled) to the glass etching surface 113 by the filling member 180 to prevent delamination from the glass etching surface 113.

The filling member 180 according to one example may be formed by filling (burying) liquid resin, for example, organic resin between the glass etching surface 113 and the bending portion BP of the flexible display panel 130, through a jetting process or a dispensing process and then hardening the resin through a hardening process. The filling member 180 may be made of the liquid resin and therefore filled (permeated) up to the boundary portion (or gap) between the glass etching surface 113 and the flexible display panel 130. To this end, the filling member 180 may include a material having moisture-proof characteristic while having adhesive characteristic, and may include an optical bond hardened by ultraviolet (UV) rays. For example, the filling member 180 may include an acryl or silicon based organic adhesive material.

Optionally, each of the flexible display panel 130 arranged on the front surface of the glass substrate 110 and the radiation member 170 arranged on the rear surface of the glass substrate 110 may be protruded to the outside of the glass etching surface 113. In this case, a width W1 of the glass etching surface 113 may be narrower than that of the bending portion BP of the flexible display panel 130 around the first direction X. In this case, the flexible display panel 130 may have a width W2 wider than the glass substrate 110 by the remaining width of the bending portions BP except for the width W1 of the glass etching surface 113 in a width of the bending portions BP (or bending display portions) around the first direction X. Therefore, the bending portion BP of the flexible display panel 130 may be protruded to the outside of the glass etching surface 113.

The radiation member 170 attached to the rear surface of the glass substrate 110 may have a width wider than that of the glass substrate 110 around the first direction X. Both edge portions of the radiation member 170, which are parallel with a second direction Y crossing the first direction X, may be overlapped with the bending portion BP of the flexible display panel 130 protruded to the outside of the glass etching surface 113. The protrusion of the radiation member 170 may be bent in a curved shape together with the bending portion BP of the flexible display panel 130 that is bent in a curved shape.

The filling member 180 may be interposed between the bending portion BP of the flexible display panel 130 protruded to the outside of the glass etching surface 113 and both edge portions of the radiation member 170, whereby the glass etching surface 113 may be surrounded by the filling member 180 and therefore may not be exposed to the outside.

The flexible display apparatus 20 according to another embodiment of the present disclosure may have the same effect as that of the display apparatus 10 according to the embodiment of the present disclosure shown in FIGS. 1 to 3, and may further improve reliability against water or oxygen by the glass substrate 110 and the filling member 180, as the glass etching surface 113 is sealed by the filling member 180.

Figure 8:
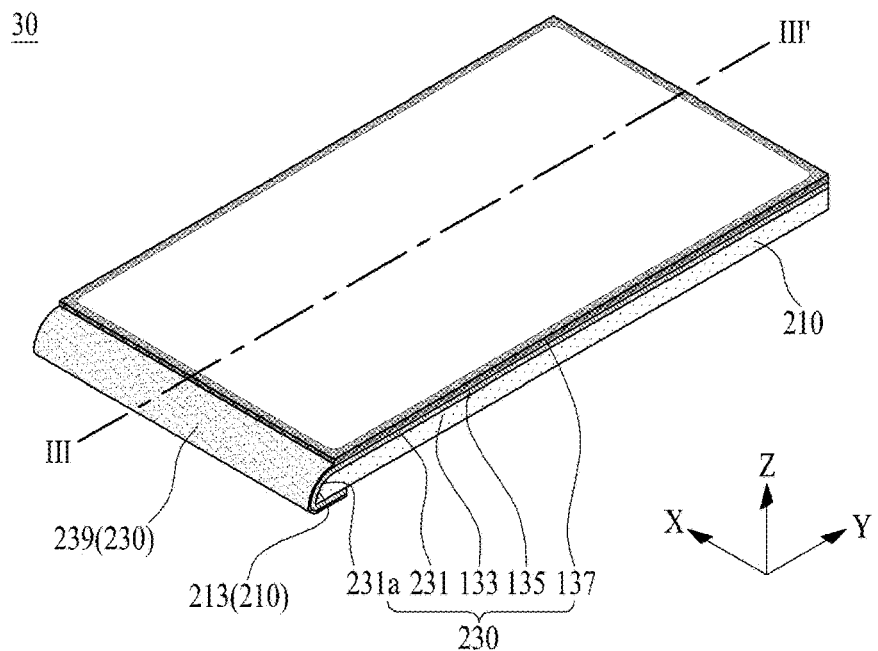
FIG. 8 is a perspective view illustrating a flexible display apparatus according to still another embodiment of the present disclosure.
Figure 9:
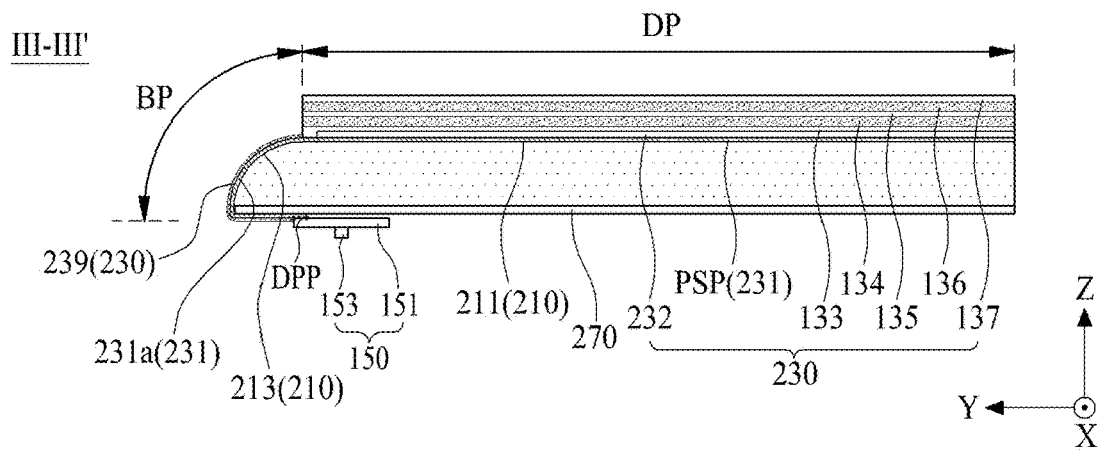
FIG. 9 is a cross-sectional view taken along line shown in FIG. 8.
Figure 10:
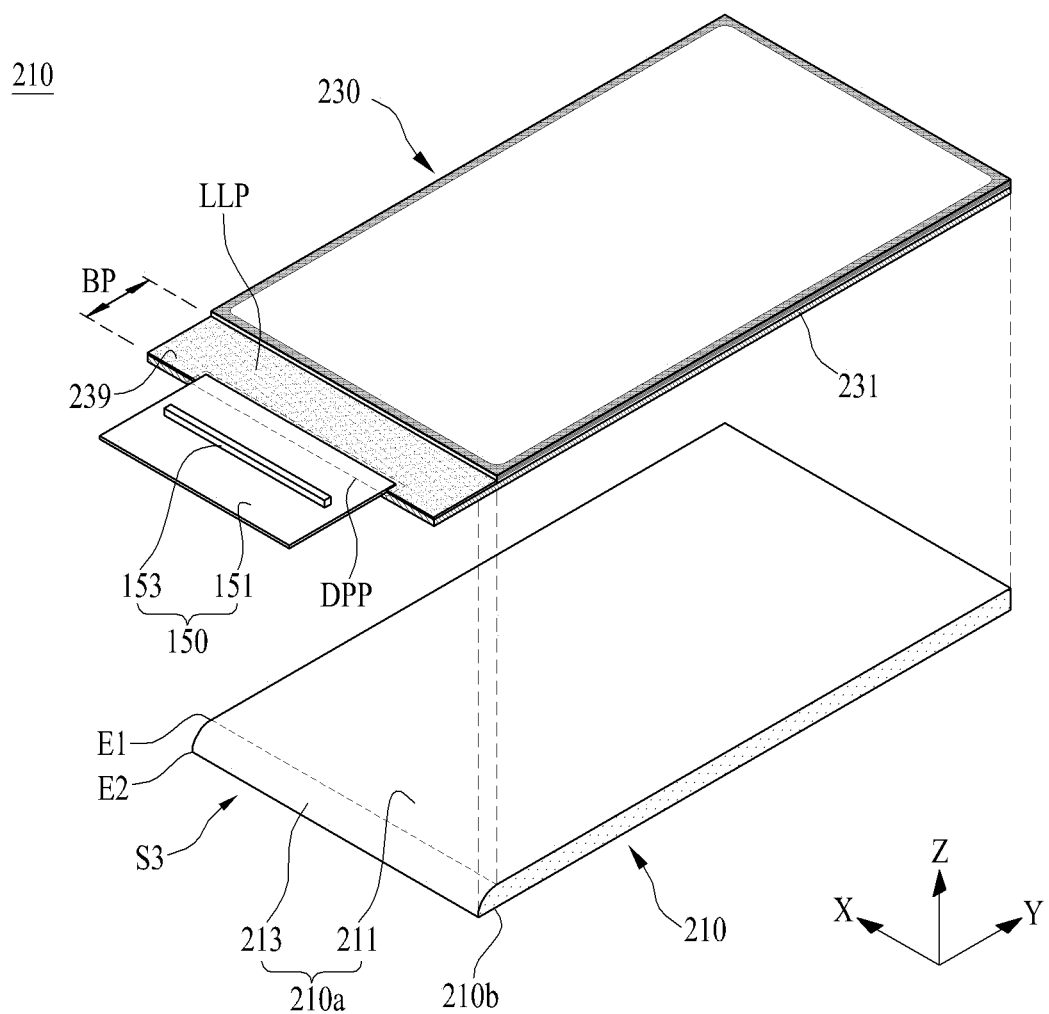
FIG. 10 is an exploded perspective view illustrating a flexible display apparatus shown in FIG. 8.

FIG. 8 is a perspective view illustrating a flexible display apparatus according to still another embodiment of the present disclosure, FIG. 9 is a cross-sectional view taken along line shown in FIG. 8, and FIG. 10 is an exploded perspective view illustrating a flexible display apparatus shown in FIG. 8. In the flexible display apparatus of FIGS. 8 to 10, the position of the glass etching surface in the flexible display apparatus according to the embodiment of the present disclosure shown in FIGS. 1 to 3 is modified. Therefore, in the following description, repeated description of the other elements except the glass etching surface and its related elements will be omitted or briefly made.

With reference to FIGS. 8 to 10, the flexible display apparatus 30 according to still another embodiment of the present disclosure may include a glass substrate 210, and a flexible display panel 230.

The glass substrate 210 may include a front surface 210a, which includes a flat surface 211 and a glass etching surface 213 of a non-flat structure, from which the flat surface 211 is partially removed, and a rear surface 210b opposite to the front surface 210a.

Because the glass substrate 210 according to this embodiment is the same as the glass substrate 110 shown in FIGS.

1 to 3 except that the glass etching surface 213 is arranged on a third edge portion of the front surface 210a and the flat surface 211 is arranged on the other portion except the third edge portion (for example, upper edge portion or lower edge portion), its repeated description will be omitted or briefly made.

Because the glass etching surface 213 of the glass substrate 210 according to this embodiment has an inverse tapered structure as shown in FIG. 4A or FIG. 5A or a forward tapered structure as shown in FIG. 5B in accordance with the glass etching process, its repeated description will be omitted. Because the glass etching surface 213 is arranged between an end E1 of the flat surface 211 and a rear end E2 of the glass substrate 210 around a long side length direction Y of the glass substrate 210, the glass etching surface 213 may be defined as a third side S3.

The flexible display panel 230 may include a bending portion BP arranged on the glass etching surface 213 of the glass substrate 210. For example, the flexible display panel 230 may include a bending portion BP arranged on the front surface 210a of the glass substrate 210 and bent in a curved shape along the glass etching surface 213 of the glass substrate 210. The flexible display panel 230 may be the same as the flexible display panel 130 shown in FIGS. 1 to 3 except that it includes the bending portion BP set at the third edge portion including a display pad portion DPP and a link line portion LLP.

The flexible display panel 230 according to one example may include a flexible substrate 231, a pixel array portion 232, an encapsulation portion 133, and a functional film 137.

The flexible substrate 231 may include a plane support portion PSP directly coupled with the flat surface 211 of the glass substrate 210, and a bending support portion 231a extended from the plane support portion PSP and bent in a curved shape and therefore arranged on the glass etching surface 213 of the glass substrate 210.

The plane support portion PSP may be defined as the other portion except the third edge portion. The bending support portion 231a may be defined as the third edge portion including the display pad portion DPP and the link line portion LLP. Because the flexible substrate 231 is substantially the same as the flexible substrate 131 shown in FIGS. 1 to 3 except that the bending support portions 131a and 13 lb of the flexible substrate 131 are modified to the third edge portion, its repeated description will be omitted or briefly made.

Because the pixel array portion 232 is the same as the pixel array portion 132 shown in FIGS. 1 to 3 except that it includes a display portion DP arranged on the plane support portion PSP of the flexible substrate 231, its repeated description will be omitted.

Because the encapsulation portion 133, the transparent adhesive member 134, the touch electrode portion 135, the film adhesive member 136 and the functional film 137 are respectively the same as those shown in FIGS. 1 to 3 except that they are arranged on the pixel array portion 232, which is arranged on the plane support portion PSP of the flexible substrate 231, their repeated description will be omitted.

The flexible display panel 230 according to this embodiment may further include a coating layer 239. The coating layer 239 may be coated on the bending portion BP of the flexible substrate 231 to cover the link line portion LLP of the flexible substrate 231 arranged between the encapsulation portion 133 and the flexible circuit film 151. The coating layer 239 according to one example may include a polymer material. The coating layer 239 protects link lines of the link line portion LLP from external impact and prevents moisture permeation into the link lines from occurring. Particularly, the coating layer 239 serves to place the link line on a neutral plane when the bending portion BP of the flexible substrate 231 is bent in a curved shape having a certain curvature radius. For example, when the bending portion BP of the flexible substrate 231 is bent in a certain curvature radius, a neutral plane where tensile and compressive become 0 (zero) exists between the flexible substrate 231 and the coating layer 239. Therefore, the coating layer 239 may include a material having an elastic coefficient higher than the flexible substrate 231 such that the link lines may be located on the neutral plane. As the link lines may be located on the neutral plane between the coating layer 239 and the flexible substrate 231, when the bending portion BP of the flexible substrate 231 is bent in a curved shape, bending stress of 0 (zero) is applied to the bending portion BP, whereby the bending portion BP may be bent without being damaged by bending stress.

The flexible display apparatus 30 according to still another embodiment of the present disclosure may further include a panel driving circuit portion 150 attached to the display pad portion DPP of the flexible display panel 230. Because the panel driving circuit portion 150 includes a flexible circuit film 151 and a driving integrated circuit 153 as shown in FIG. 1, its repeated description will be omitted.

As the bending portion BP is bent in a curved shape by a panel bending process, the flexible display panel 230 connected with the panel driving circuit portion 150 may be attached to the glass etching surface 213 of the glass substrate 210, whereby the panel driving circuit portion 150 may be arranged on a rear edge portion of the glass substrate 210. In this case, the bending portion BP of the flexible display panel 230 may be attached to the glass etching surface 213 of the glass substrate 210 by an adhesive member such as an adhesive. Optionally, the third edge portion of the flexible substrate 231 overlapped with the display pad portion PDP and bent toward the rear edge portion of the glass substrate 210 may be attached to the rear edge portion of the glass substrate 210 by the adhesive member.

The flexible display apparatus 30 according to still another embodiment of the present disclosure may have the same effect as that of the display apparatus 10 according to one embodiment of the present disclosure shown in FIGS. 1 to 3, and may reduce or minimize a width of the bezel area as the bending portion BP (or the third edge portion) of the flexible display panel 230 including the display pad portion DPP and the link line portion LLP is bent in a curved shape along the glass etching surface 213 of the glass substrate 210.

Figure 11:
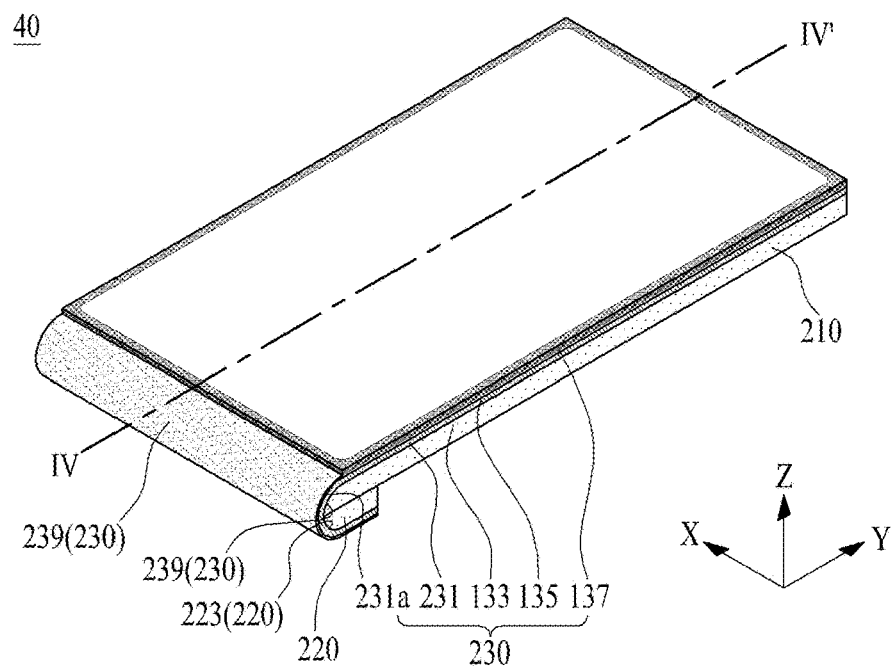
FIG. 11 is a perspective view illustrating a flexible display apparatus according to still another embodiment of the present disclosure.
Figure 12:
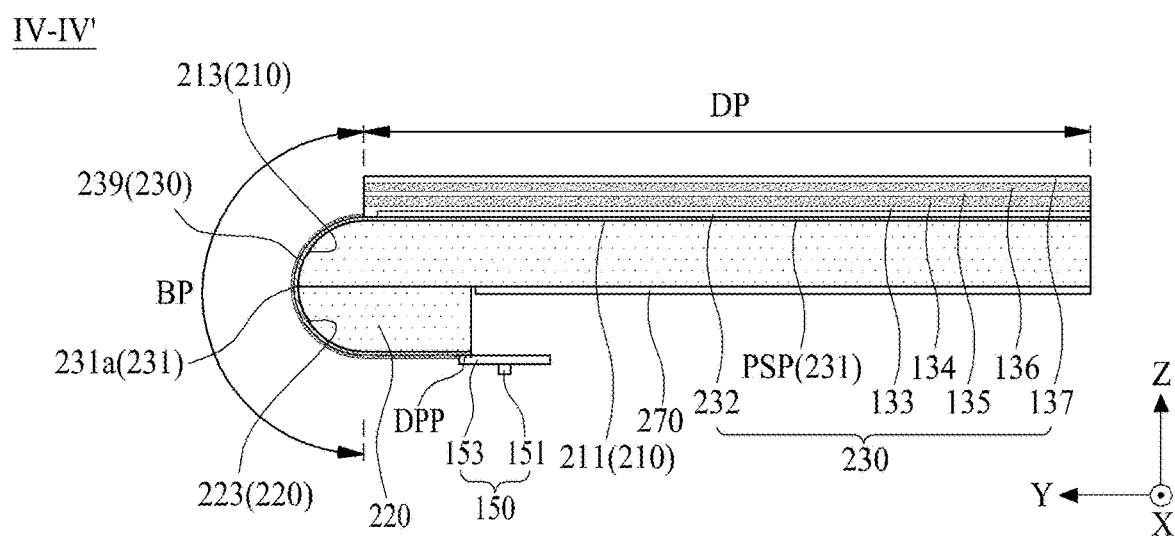
FIG. 12 is a cross-sectional view taken along line IV-IV' shown in FIG. 11.
Figure 13:
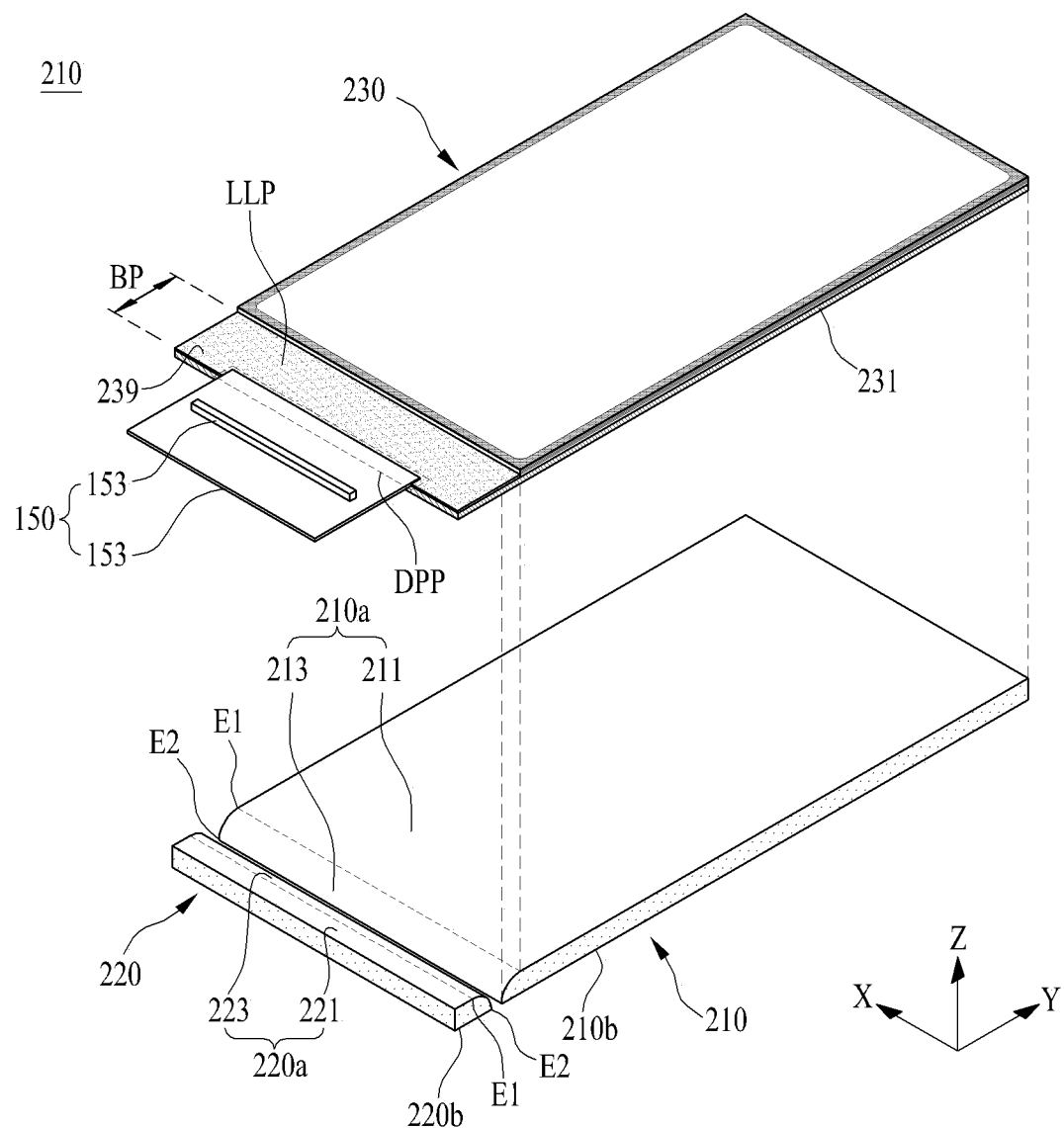
FIG. 13 is an exploded perspective view illustrating a flexible display apparatus shown in FIG. 11.

FIG. 11 is a perspective view illustrating a flexible display apparatus according to still another embodiment of the present disclosure, FIG. 12 is a cross-sectional view taken along line IV-IV' shown in FIG. 11, and FIG. 13 is an exploded perspective view illustrating a flexible display apparatus shown in FIG. 11. In the flexible display apparatus of FIGS. 11 to 13, an auxiliary glass substrate is additionally provided in the flexible display apparatus according to still another embodiment of the present disclosure shown in FIGS. 8 to 10. Therefore, in the following description, repeated description of the other elements except the auxiliary glass substrate and its related elements will be omitted or briefly made.

With reference to FIGS. 11 to 13, in the flexible display apparatus 40 according to still another embodiment of the present disclosure, the auxiliary glass substrate 220 may be coupled with the third edge portion of the flexible display panel 230 including the display panel pad portion DPP, and may support the bending portion BP of the flexible display panel 230. The auxiliary glass substrate 220 may be formed together with the glass substrate 210 by the glass etching process.

The auxiliary glass substrate 220 according to one example may include a front surface 220a, which includes an auxiliary flat surface 221 and an auxiliary glass etching surface 223 of a non-flat structure, from which the auxiliary flat surface 221 is partially removed, and a rear surface 220b opposite to the front surface 220a. In this case, the auxiliary glass etching surface 223 of the auxiliary glass substrate 220 may be formed in parallel with the glass etching surface 213 of the glass substrate 210 while directly facing the glass etching surface 213 of the glass substrate 210, and therefore may be overlapped with the bending portion BP of the flexible display panel 230 together with the glass etching surface 213 of the glass substrate 210.

The front surface 220a of the auxiliary glass substrate 220 according to one example may include an auxiliary flat surface 221 coupled with the third edge portion (for example, upper edge portion or lower edge portion) of the flexible display panel 230 including the display pad portion DPP, and an auxiliary glass etching surface 223 supporting a portion of the bending portion BP of the flexible display panel 230 adjacent to the display pad portion DPP.

The auxiliary flat surface 221 of the auxiliary glass substrate 220 according to one example may directly be coupled with a portion of the bending support portion 231a of the flexible substrate 231 adjacent to the display pad portion DPP without an adhesive member.

Because the auxiliary glass etching surface 223 of the auxiliary glass substrate 220 according to this embodiment has an inverse tapered structure as shown in FIG. 4A or FIG. 5A or a forward tapered structure as shown in FIG. 5B in accordance with the glass etching process, its repeated description will be omitted. The auxiliary glass etching surface 223 may have a section of an inverse tapered structure or a forward tapered structure between an end E1 of the auxiliary flat surface 221 and a rear end E2 of the glass substrate 210 around a long side length direction Y of the glass substrate 210.

The auxiliary glass substrate 220 according to one example may support a half area of the bending portion BP of the flexible display panel 230, which is adjacent to the display pad portion DPP, in a curved shape through the auxiliary glass etching surface 223. The auxiliary glass substrate 220 may be arranged to be overlapped with the rear edge portion of the glass substrate 210 by a bending process of the flexible display panel 230. In this case, the rear surface 220b of the auxiliary glass substrate 220 may be attached to the rear surface 210b of the glass substrate 210 by an adhesive member such as an adhesive.

The flexible display apparatus 40 according to still another embodiment of the present disclosure may have the same effect as that of the display apparatus 30 according to the embodiment of the present disclosure shown in FIGS. 8 to 10, and may reduce the bezel area as the bending portion BP (or the third edge portion) of the flexible display panel 230 is bent in a semi-circle shape along the glass etching surface 213 of the glass substrate 210 and the auxiliary glass etching surface 223 of the auxiliary glass substrate 220. It may also reduce bending stress of the bending portion BP of the flexible display panel 230.

Figure 14:
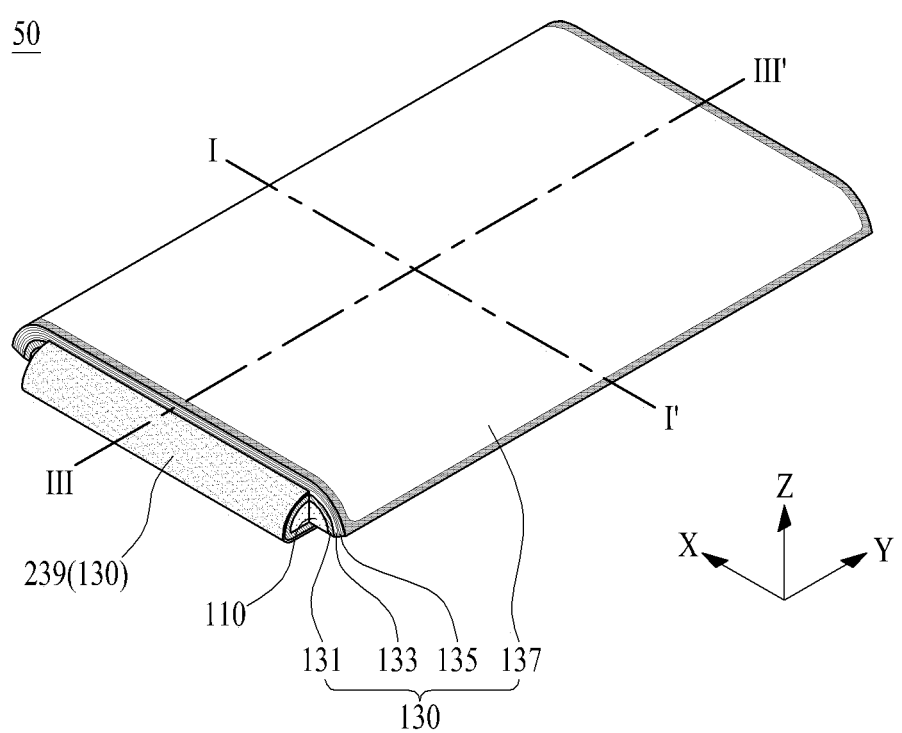
FIG. 14 is a perspective view illustrating a flexible display apparatus according to still another embodiment of the present disclosure.
Figure 15:
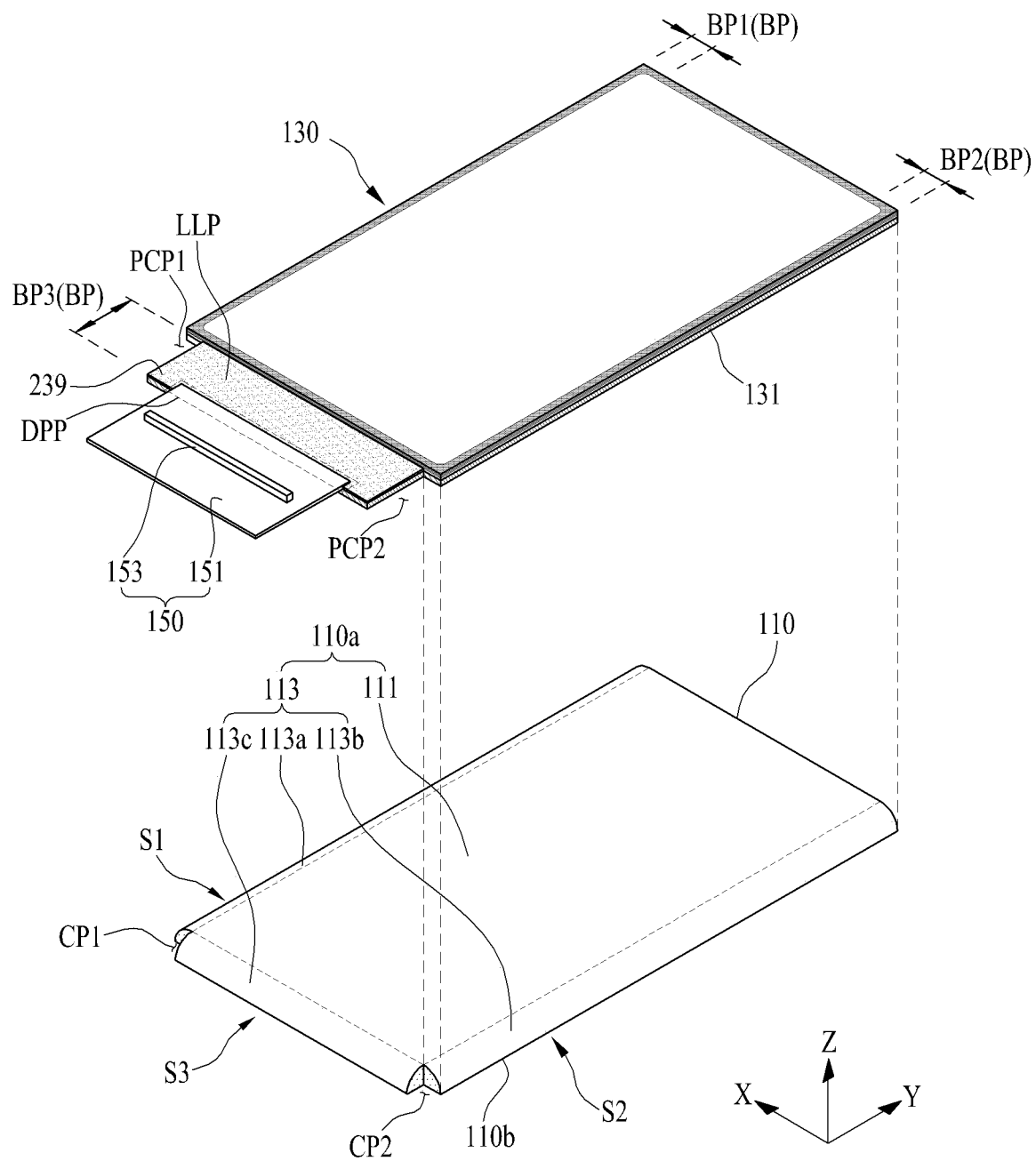
FIG. 15 is an exploded perspective view illustrating a flexible display apparatus shown in FIG. 14.

FIG. 14 is a perspective view illustrating a flexible display apparatus according to still another embodiment of the present disclosure, and FIG. 15 is an exploded perspective view illustrating a flexible display apparatus shown in FIG. 14. The flexible display apparatus of FIGS. 14 and 15 is provided by combining the display apparatus shown in FIGS. 1 to 3 with the display apparatus shown in FIGS. 8 to 10. The section of line I-I' shown in FIG. 14 is shown in FIG. 3, and the section of line shown in FIG. 14 is shown in FIG. 9.

With reference to FIGS. 3, 9, 14 and 15, the flexible display apparatus 50 according to still another embodiment of the present disclosure may include a glass substrate 110 and a flexible display panel 130.

The glass substrate 110 may include a front surface 110a, which includes a flat surface 111 and a glass etching surface 113 of a non-flat structure, from which the flat surface 111 is partially removed, and a rear surface 110b opposite to the front surface 110a.

The flat surface 111 of the glass substrate 210 according to this embodiment may be defined as the other portion except first to third edge portions of the front surface 110a of the glass substrate 110. For example, in the glass substrate 110, the first edge portion may be defined as a left edge portion, the second edge portion may be defined as a right edge portion, and the third edge portion may be defined as an upper (or lower) edge portion. Because the flat surface 111 of the glass substrate 110 is the same as the flat surface of the glass substrate 110 shown in FIGS. 1 to 3 except that it is not arranged on the third edge portion, its repeated description will be omitted.

The glass etching surface 113 of the glass substrate 110 according to this embodiment may be arranged on each of the first to third edge portions of the glass substrate 110. The glass etching surface 113 according to one example may include a first glass etching surface 113a (or first panel support portion) formed on the first edge portion of the glass substrate 110, a second glass etching surface 113b (or second panel support portion) formed on the second edge portion of the glass substrate 110, and a third glass etching surface 113c (or third panel support portion) formed on the third edge portion of the glass substrate 110. In this case, the first glass etching surface 113a may be defined as a first side S1 (or left side) of the glass substrate 110, the second glass etching surface 113b may be defined as a second side S2 (or right side) of the glass substrate 110, and the third glass etching surface 113c may be defined as a third side S3 (or upper side) of the glass substrate 110.

The first and second glass etching surfaces 113a and 113b may substantially be the same as the first and second glass etching surfaces shown in FIG. 2. The third glass etching surface 113c may substantially be the same as the glass etching surface 213 shown in FIG. 10. Because each of the first to third glass etching surfaces 113a, 113b and 113c has an inverse tapered structure as shown in FIG. 4A or FIG. 5A or a forward tapered structure as shown in FIG. 5B in accordance with the glass etching process, its repeated description will be omitted.

The glass substrate 110 according to this embodiment may further include a first corner cutting portion CP1 arranged between the first glass etching surface 113a and the third glass etching surface 113c, and a second corner cutting portion CP2 arranged between the second glass etching surface 113b and the third glass etching surface 113c.

The first corner cutting portion CP1 may be defined as a portion in which a first edge portion of the glass substrate 110 where the first glass etching surface 113a and the third glass etching surface 113c cross each other is removed. The second corner cutting portion CP2 may be defined as a portion in which a second edge portion of the glass substrate 110 where the second glass etching surface 113b and the third glass etching surface 113c cross each other is removed. Each of the first and second corner cutting portions CP1 and CP2 may be formed together with the first to third glass etching surfaces 113a, 113b and 113c by the glass etching process.

The flexible display panel 130 may include a plane display portion PDP arranged on the flat surface 111 of the glass substrate 110, and a bending portion BP arranged on the glass etching surface 113 of the glass substrate 110. For example, the flexible display panel 130 may include a bending portion BP arranged on the front surface 110a of the glass substrate 110 and bent in a curved shape along the glass etching surface 113 of the glass substrate 110. The flexible display panel 130 may be the same as the flexible display panel 130 shown in FIGS. 1 to 3 except that it further includes the bending portion BP set at the third edge portion including a display pad portion DPP and a link line portion LLP.

The bending portion BP of the flexible display panel 130 according to this embodiment may include a first bending portion BP1 overlapped with the first glass etching surface 113a of the glass substrate 110, a second bending portion BP2 overlapped with the second glass etching surface 113b of the glass substrate 110, and a third bending portion BP3 overlapped with the third glass etching surface 113c of the glass substrate 110. In this case, in the flexible display panel 130, the first bending portion BP1 may include a first bending display portion BDP1, the second bending portion BP2 may include a second bending display portion BDP2, and the third bending portion BP3 may include a link line portion LLP.

The flexible display panel 130 according to one example may include a flexible substrate 131, a pixel array portion 132, an encapsulation portion 133, and a functional film 137.

The flexible substrate 131 may include a plane support portion PSP directly coupled with the flat surface 111 of the glass substrate 110, and a bending support portion extended from the plane support portion PSP and bent in a curved shape, and therefore arranged on the glass etching surface 213 of the glass substrate 210.

The plane support portion PSP may be defined as the other portion except the third edge portion.

The bending support portion may be defined as the first to third edge portions. The bending support portion according to this embodiment may include a first bending support portion 131a defined as the first edge portion, a second bending support portion 131b defined as the second edge portion, and a third bending support portion 231a defined as the third edge portion. The bending support portion may substantially be the same as the bending support portion of the flexible substrate 131 shown in FIGS. 1 to 3 except that it further includes the third bending support portion 231a, and the third bending support portion 231a may be the same as the bending support portion of the flexible substrate 131 shown in FIGS. 8 to 10.

The first bending support portion 131a may be attached to the first glass etching surface 113a of the glass substrate 110 by the adhesive member. The second bending support portion 131b may be attached to the second glass etching surface 113b of the glass substrate 110 by the adhesive member. The third bending support portion 231a may be attached to the third glass etching surface 113c of the glass substrate 110 by the adhesive member.

The flexible substrate 131 according to this embodiment may further include first and second panel corner cutting portions PCP1 and PCP2 for individual bending of each of the first to third bending support portions 131a, 131b and 231a.

The first panel corner cutting portion PCP1 may be defined as a portion in which a first edge portion of the flexible substrate 131 where the first bending support portion 131a and the third bending support portion 231a cross each other is removed. The second panel corner cutting portion PCP2 may be defined as a portion in which a second edge portion of the flexible substrate 131 where the second bending support portion 131b and the third bending support portion 231a cross each other is removed. Each of the first and second panel corner cutting portions PCP1 and PCP2 may be formed by a scribing process using a laser.

The pixel array portion 132 may include a plane display portion PDP arranged on the plane support portion PSP, and a bending display portion having a first bending display portion BDP1 and a second bending display portion BDP2, which are respectively arranged on the first bending support portion 131a and the second bending support portion 131b of the flexible substrate 131. Because the pixel array portion 132 is substantially the same as the pixel array portion shown in FIGS. 1 to 3, its repeated description will be omitted.

Because the encapsulation portion 133, the transparent adhesive member 134, the touch electrode portion 135, the film adhesive member 136 and the functional film 137 are respectively the same as those shown in FIGS. 1 to 3 except that they are arranged on the pixel array portion 132 arranged on the plane support portion PSP of the flexible substrate 131, their repeated description will be omitted. The flexible display apparatus 50 according to still another embodiment of the present disclosure may have both the same effect of the display apparatus 10 shown in FIGS. 1 to 3 and the same effect of the display apparatus 30 shown in FIGS. 8 to 10. That is, the flexible display apparatus 50 according to still another embodiment of the present disclosure may reduce or minimize a width of the bezel area due to the first to third bending portions BP1, BP2 and BP3 of the flexible display panel 130 arranged on the first to third glass etching surfaces 113a, 113b and 113c of the glass substrate 110 in a curved shape.

Figure 16:
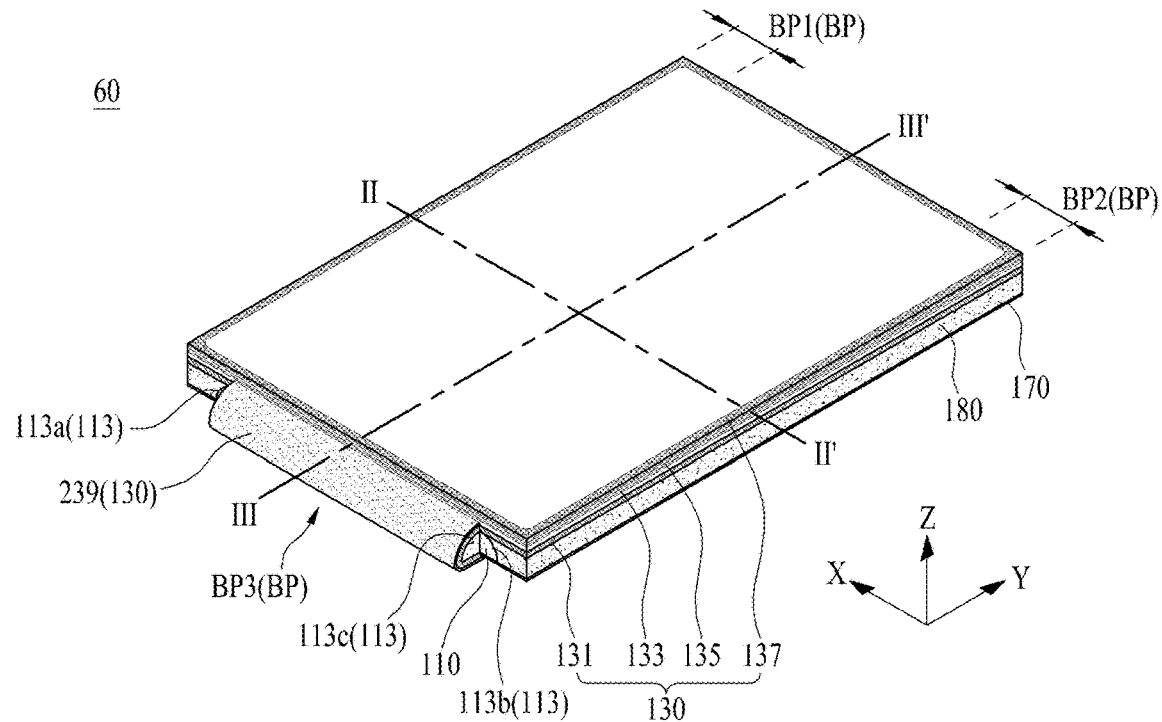
FIG. 16 is a perspective view illustrating a flexible display apparatus according to still another embodiment of the present disclosure.

FIG. 16 is a perspective view illustrating a flexible display apparatus according to still another embodiment of the present disclosure. The flexible display apparatus of FIG. 16 is provided by combining the display apparatus shown in FIGS. 6 and 7 with the display apparatus shown in FIGS. 8 to 10. The section of line II-II' shown in FIG. 16 is shown in FIG. 7, and the section of line III-III' shown in FIG. 16 is shown in FIG. 9.

With reference to FIGS. 7, 9 and 16, the flexible display apparatus 60 according to further still another embodiment of the present disclosure may include a glass substrate 110 and a flexible display panel 130.

The glass etching surface 113 of the glass substrate 110 according to this embodiment, as shown in FIGS. 14 and 15, may include a first glass etching surface 113a (or first panel support portion) formed on the first edge portion of the glass substrate 110, a second glass etching surface 113b (or second panel support portion) formed on the second edge portion of the glass substrate 110, and a third glass etching surface 113c (or third panel support portion) formed on the third edge portion of the glass substrate 110. Because the glass etching surface 113 is substantially the same as the glass etching surface 113 shown in FIGS. 14 and 15, its repeated description will be omitted.

Because the flexible display panel 130 according to this embodiment is substantially the same as the flexible display panel shown in FIGS. 6 and 7 except that the third edge portion including the display pad portion DPP and the line link portion LLP is provided to be bent in a curved shape, its repeated description will be omitted.

The third edge portion of the flexible display panel 130 according to this embodiment may be bent to surround the third glass etching surface 113c of the glass substrate 110. In this case, the line link portion LLP of the flexible display panel 130 may be bent in a curved shape and therefore arranged or attached onto the third glass etching surface 113c of the glass substrate 110. The display pad portion DPP of the flexible display panel 130 may be arranged at the rear edge portion of the glass substrate 110.

The flexible display apparatus 60 according to still another embodiment of the present disclosure may have both the same effect of the display apparatus 20 shown in FIGS. 6 and 7 and the same effect of the display apparatus 30 shown in FIGS. 8 to 10.

Figure 17:
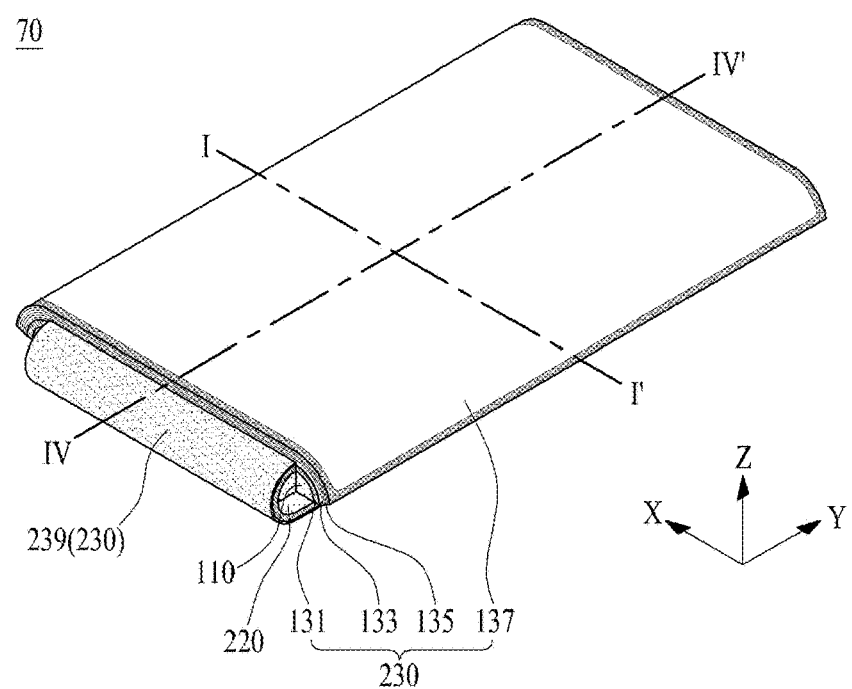
FIG. 17 is a perspective view illustrating a flexible display apparatus according to still another embodiment of the present disclosure.
Figure 18:
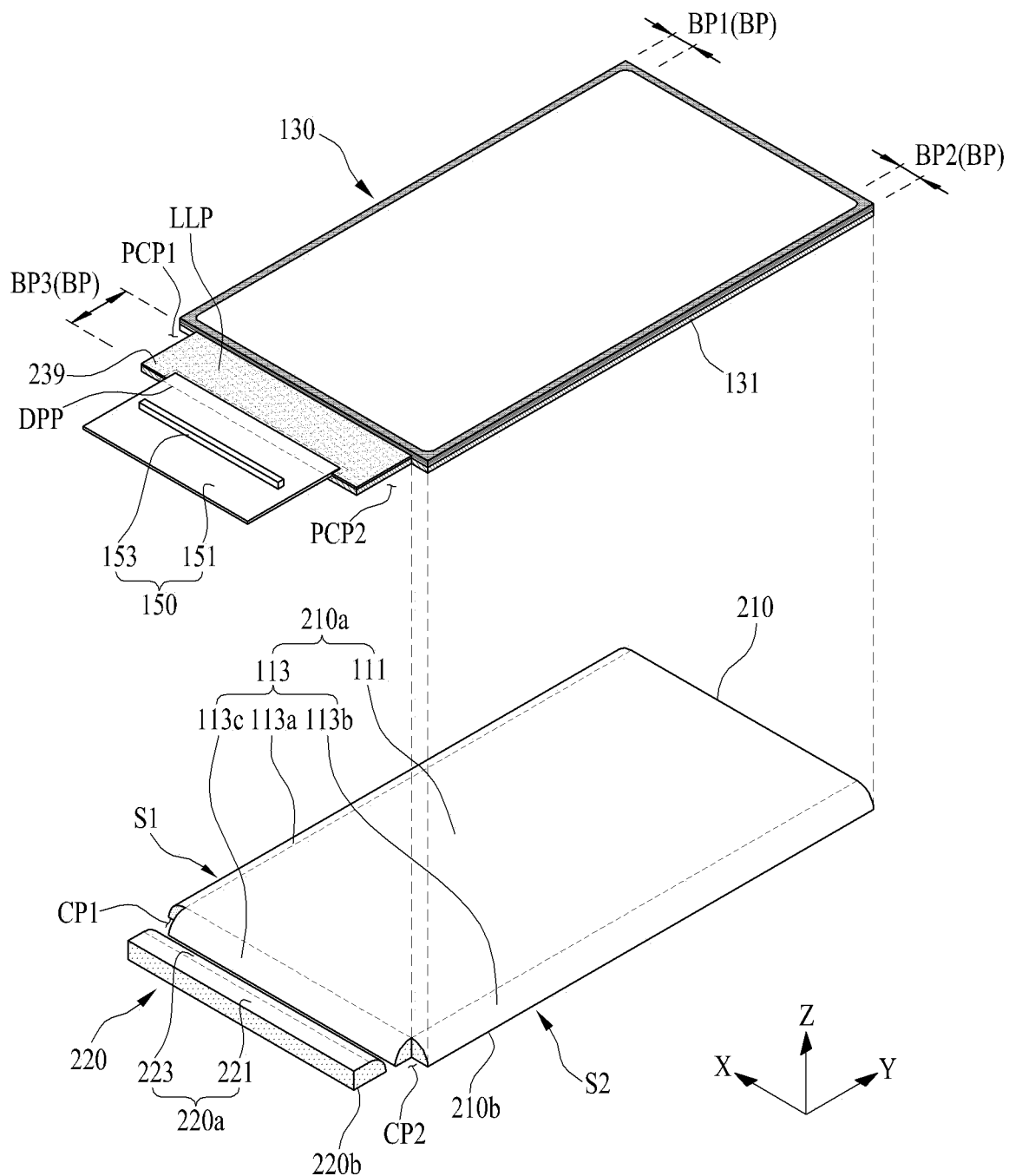
FIG. 18 is an exploded perspective view illustrating a flexible display apparatus shown in FIG. 17.

FIG. 17 is a perspective view illustrating a flexible display apparatus according to still another embodiment of the present disclosure, and FIG. 18 is an exploded perspective view illustrating a flexible display apparatus shown in FIG. 17. The flexible display apparatus of FIGS. 17 and 18 is provided by combining the display apparatus shown in FIGS. 1 to 3 with the display apparatus shown in FIGS. 11 to 13. The section of line I-I' shown in FIG. 17 is shown in FIG. 3, and the section of line IV-IV' shown in FIG. 17 is shown in FIG. 12.

With reference to FIGS. 3, 12, 17 and 18, the flexible display apparatus 70 according to still another embodiment of the present disclosure may include a glass substrate 110, a flexible display panel 130, and an auxiliary glass substrate 220. That is, in the flexible display apparatus 70 according to still another embodiment of the present disclosure, the auxiliary glass substrate 220 of the display apparatus 40 shown in FIGS. 11 to 13 is applied to the display apparatus 50 shown in FIGS. 14 and 15.

Because the glass substrate 110 is substantially the same as the glass substrate shown in FIGS. 14 and 15, the same reference numeral is given and its repeated description will be omitted. Furthermore, because the flexible display panel 130 is substantially the same as the flexible display panel shown in FIGS. 14 and 15, the same reference numeral is given and its repeated description will be omitted.

The auxiliary glass substrate 220 is coupled with the third edge portion of the flexible display panel 130 including a display pad portion DPP, and supports the third bending portion BP3 of the flexible display panel 130. The auxiliary glass substrate 220 may be formed together with the glass substrate 110 by the glass etching process according to the over etch condition. The auxiliary glass substrate 220 may include a front surface 220a, which includes an auxiliary flat surface 221 coupled with the third edge portion of the flexible display panel 130 overlapped with the display pad portion DPP and an auxiliary glass etching surface 223 supporting a portion of the third bending portion BP3 of the flexible display panel 130, and a rear surface 220b opposite to the front surface 220a and attached to the rear surface 110a of the glass substrate 110. Because the auxiliary glass substrate 220 is the same as the auxiliary glass substrate of the display apparatus 40 shown in FIGS. 11 to 13, the same reference numeral is given and its repeated description will be omitted.

The flexible display apparatus 70 according to still another embodiment of the present disclosure may have both the same effect of the display apparatus 10 shown in FIGS. 1 to 3 and the same effect of the display apparatus 40 shown in FIGS. 11 to 13. That is, the flexible display apparatus 70 according to still another embodiment of the present disclosure may reduce or minimize a width of the bezel area due to the first to third bending portions BP1, BP2 and BP3 of the flexible display panel 130 arranged on the first to third glass etching surfaces 113a, 113b and 113c of the glass substrate 110 in a curved shape.

Figure 19:
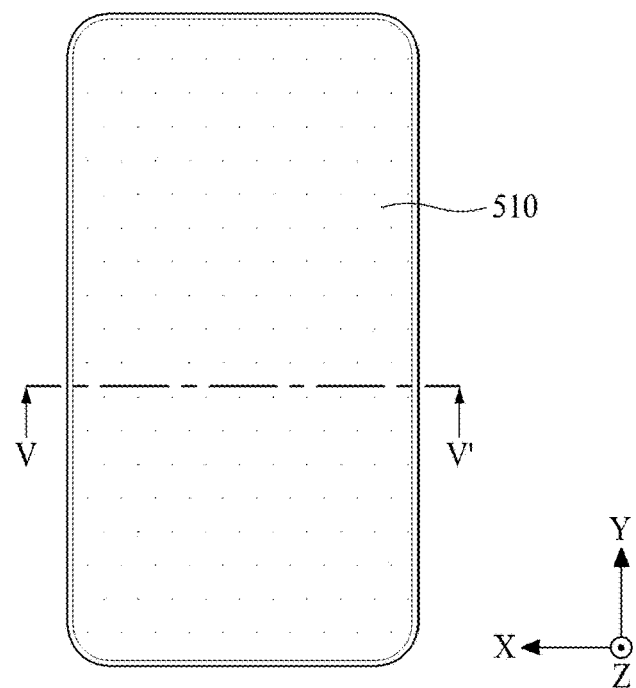
FIG. 19 is a plane view illustrating an electronic device according to one embodiment of the present disclosure.
Figure 20:
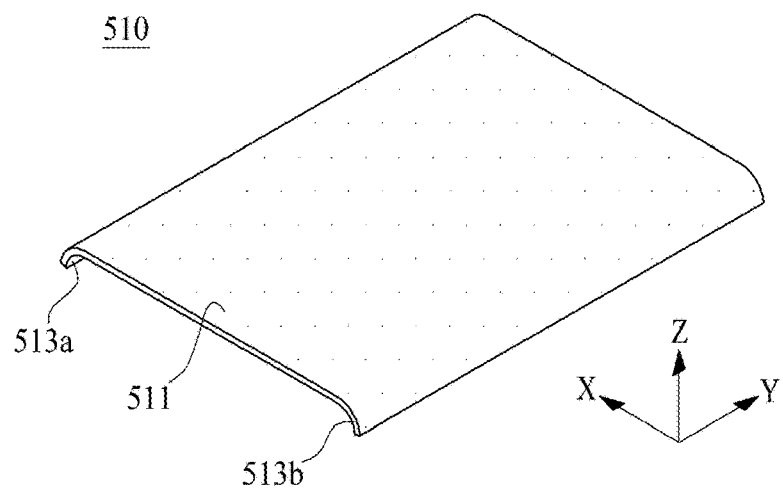
FIG. 20 is a perspective view illustrating a cover window shown in FIG. 19.
Figure 21:
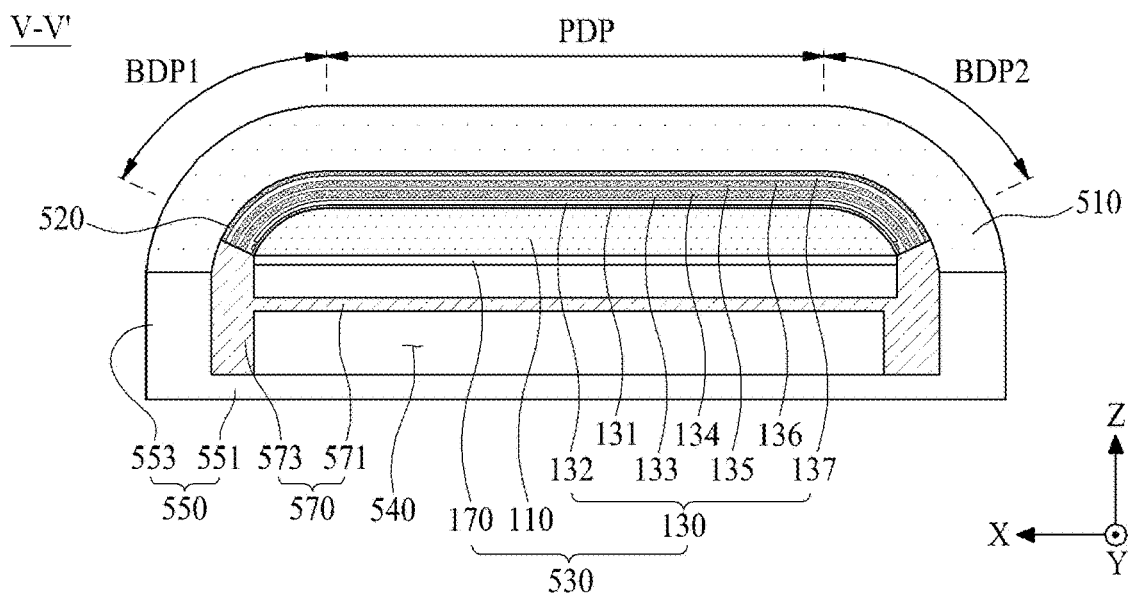
FIG. 21 is a cross-sectional view taken along line V-V' shown in FIG. 19.

FIG. 19 is a plane view illustrating an electronic device according to an embodiment of the present disclosure, FIG. 20 is a perspective view illustrating a cover window shown in FIG. 19, and FIG. 21 is a cross-sectional view taken along line V-V' shown in FIG. 19.

With reference to FIGS. 19 to 21, the electronic device according to an embodiment of the present disclosure may include a cover window 510, a display module 530, and a housing 550.

The cover window 510 may serve to protect the display module 530 from external impact by covering a front surface and a side of the display module 530. The cover window 510 according to one example may be made of a transparent plastic material, a glass material, or a reinforcing glass material. As an example, the cover window 510 may have one or a deposited structure of sapphire glass and gorilla glass. As another example, the cover window 510 may include any one of PET(polyethyleneterephthalate), PC(polycarbonate), PES(polyethersulfone), PEN(polyethylenapthanate), and PNB(polynorborneen). The cover window 510 may be made of reinforcing glass in consideration of scratch and transparency.

The cover window 510 according to one example may include a front window 511, a first bending window 513a, and a second bending window 513b. The front window 511 is a center portion of the cover window 510, and may substantially have a plane shape. The front window 511 may cover the front surface of the display module 530.

The first bending window 513a may be bent from a first edge portion (or left edge portion) of the front window 511 in a curved shape. For example, the first bending window 513a may be bent from the first edge portion of the front window 511 to have a first curvature radius. The first bending window 513a may surround a first side of the display module 530.

The second bending window 513b may be bent from a second edge portion (or right edge portion) of the front window 511 in a curved shape. For example, the second bending window 513b may be bent from the second edge portion of the front window 511 to have a second curvature radius the same as or different from the first curvature radius. The second bending window 513b may surround a second side parallel with the first side of the display module 530.

The cover window 510 may have a double-sided bending structure in which first and second edge portions parallel with a long side length direction Y of the electronic device are bent from a flat panel shape to a curved shape, whereby an aesthetic sense of the electronic device may be improved, and a bezel area in a short side direction X of the electronic device may be reduced.

Additionally, the cover window 510 may further include a design (or decoration) layer provided on a edge portion. The design layer may be printed on a rear (back) edge portion of the cover window 510, which faces the display module 530, at least one time to cover a non-display area where an image is not displayed in the electronic device.

The display module 530 may be coupled with the rear surface (or back surface) of the cover window 510 to display an image or sense a user's touch. The display module 530 may be bonded to the rear surface of the front window 511 of the cover window 510 through a direct bonding process using a module bonding member 520. In this case, the module bonding member 520 may be a pressure sensitive adhesive (PSA), an optically clear adhesive (OCA), or an optically clear resin (OCR).

The display module 530 according to one example may include a glass substrate 110, a flexible display panel 130, a panel driving circuit portion 150, and a radiation member 170. Because the display module 530 including these elements is substantially the same as the display apparatus 10 shown in FIGS. 1 to 3, the same reference numerals are given to the elements and their repeated description will be omitted.

The display module 530 may be bonded to the rear surface of the front window 511 of the cover window 510 by the module bonding member 520. In this case, the module bonding member 520 may be interposed between the functional film 137 of the display module 530 and the rear surface of the front window 511 of the cover window 510.

In the flexible display panel 130, the plane display portion PDP may be overlapped with the front window 511 of the cover window 510, the first bending display portion BDP1 may be overlapped with the first bending window 513*a* of the cover window 510, and the second bending display portion BDP2 may be overlapped with the second bending window 513*b* of the cover window 510. In this case, the first bending display portion BDP1 of the flexible display panel 130 may have the same curvature radius as a first curvature radius of the first bending window 513*a,* and the second bending display portion BDP2 of the flexible display panel 130 may have the same curvature radius as a second curvature radius of the second bending window 513*b.* For example, the first bending display portion BDP1 and the first bending window 513*a* may have a concentric circle shape. Likewise, the second bending display portion BDP2 and the second bending window 513*b* may have a concentric circle shape.

The housing 550 stores the display module 530 and supports the cover window 510. The housing 550 according to one example may include a rear cover 551 covering the rear surface of the display module 530 by interposing a circuit storage space 540 between the display module 530 and the rear cover 551, and a side cover 553 supporting the cover window 510.

The rear cover 551 is arranged on a rear surface at the outermost of the electronic device, and may include a plastic material, a metal material, or a glass material. For example, the rear cover 551 may include a glass material having a color coating layer.

The side cover 553 according to one example is arranged on a side at the outermost of the electronic device, and may be bent from an edge portion of the rear cover 551 and therefore coupled with the cover window 510.

The side cover 553 according to another example is formed of a plastic material, a metal material, or a glass material, and may be arranged between the rear edge portion of the cover window 510 and the edge portion of the rear cover 551.

The circuit storage space 540 is provided between the rear surface of the display module 530 and the rear cover 551, and stores a host driving circuit, a memory, a battery, etc. therein.

The electronic device according to one embodiment of the present disclosure may further include a middle frame 570. The middle frame 570 may be arranged in the circuit storage space 540 of the housing 550 to support circuit parts arranged in the circuit storage space 540. The middle frame 570 may support the cover window 510. The middle frame 570 according to one example may include a middle plate 571 and a middle sidewall 573.

The middle plate 571 may be arranged between the rear surface of the display module 530 and the rear cover 551 to support circuit parts arranged in the circuit storage space 540 or support a display driving board arranged on the rear surface of the display module 530. For example, the display driving board may be arranged between the middle plate 571 and the rear surface of the display module 530 and electrically connect with the panel driving circuit portion 150.

The middle sidewall 573 may vertically be coupled with a side of the middle plate 571 to support the cover window 510. Optionally, the side cover 553 of the housing 550 may be replaced with the middle sidewall 573 of the middle frame 570. In this case, the middle sidewall 573 of the middle frame 570 may be arranged between the edge portion of the cover window 510 and the edge portion of the rear cover 551, whereby the side cover 553 of the housing 550 may be omitted.

The electronic device according to one embodiment of the present disclosure includes the display module 530 provided as the display apparatus 10 shown in FIGS. 1 to 3, whereby the effect of the display apparatus 10 shown in FIGS. 1 to 3 may be obtained. Also, in the electronic device according to one embodiment of the present disclosure, as the flexible display panel 130 is coupled with the glass substrate 110, heat generated in accordance with driving of the flexible display panel 130 is radiated through the glass substrate 110, whereby a radiation effect may be increased. Moreover, heat generated in accordance with driving of the flexible display panel 130 is transferred to the radiation member 170 through the glass substrate 110 and then radiated, whereby the radiation effect may be further increased.

Figure 22:
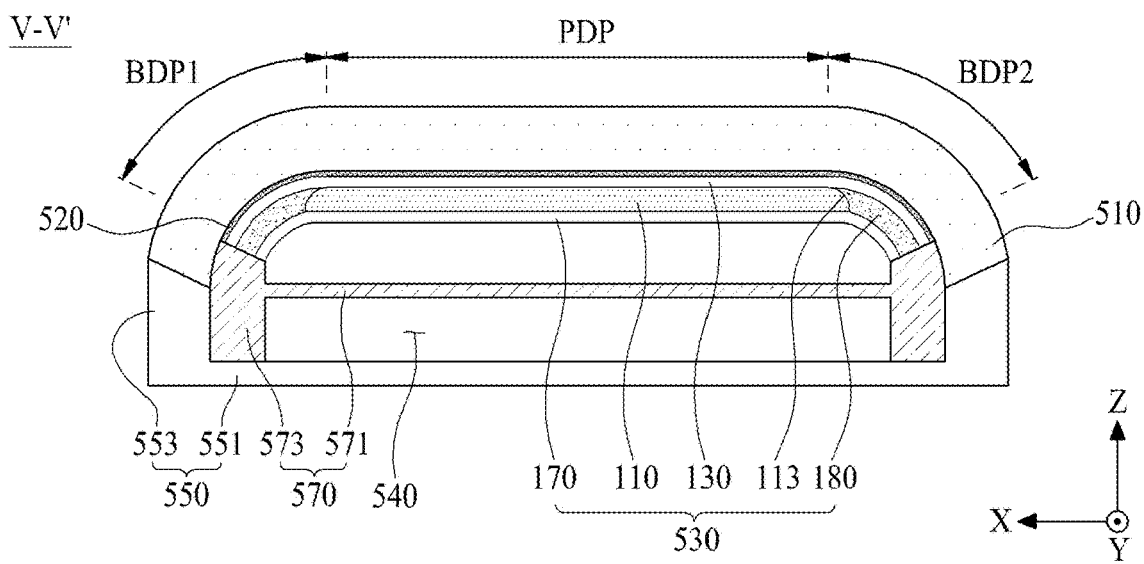
FIG. 22 is another cross-sectional view taken along line V-V' shown in FIG. 19.

FIG. 22 is another cross-sectional view taken along line V-V' shown in FIG. 19. The display module shown in FIG. 22 is provided by modifying the display module attached to the cover window shown in FIGS. 19 and 20 to the display apparatus shown in FIGS. 6 and 7.

With reference to FIGS. 19, 20 and 22, the display module 530 according to this embodiment may include a glass substrate 110, a flexible display panel 130, a panel driving circuit portion 150, a radiation member 170, and a filling member 180. Because the display module 530 including these elements is substantially the same as the display apparatus 20 shown in FIGS. 6 and 7, the same reference numerals are given to the elements and their repeated description will be omitted.

The display module 530 may be bonded to the rear surface of the cover window 510 by the module bonding member 520. In this case, the module bonding member 520 may be interposed between the functional film 137 of the display module 530 and the rear surface of the cover window 510.

In the flexible display panel 130, the plane display portion PDP may be overlapped with the front window 511 of the cover window 510, the first bending display portion BDP1 may be overlapped with the first bending window 513*a* of the cover window 510, and the second bending display portion BDP2 may be overlapped with the second bending window 513*b* of the cover window 510. In this case, the first bending display portion BDP1 of the flexible display panel 130 may have the same curvature radius as a first curvature radius of the first bending window 513*a,* and the second bending display portion BDP2 of the flexible display panel 130 may have the same curvature radius as a second curvature radius of the second bending window 513b. For example, the first bending display portion BDP1 and the first bending window 513a may have a concentric circle shape. Likewise, the second bending display portion BDP2 and the second bending window 513b may have a concentric circle shape.

The filling member 180 of the display module 530 may be bent to have a curved shape corresponding to a curved shape of the bending display portion BDP1 and BDP2 of the flexible display panel 130 attached to the bending windows 513a and 513b of the cover window 510 by the module bonding member 520. That is, because the filling member 180 has an elastic characteristic (flexible characteristic), the filling member 180 may be bent in a curved shape along the curved shape of the bending display portions BDP1 and BDP2 of the flexible display panel 130. In this case, because the bending display portions BDP1 and BDP2 of the flexible display panel 130 are bent at an angle less than 45°, the glass etching surface 113 of the glass substrate 110 may have an inverse tapered structure or a forward tapered structure, which is formed by the glass etching process according to any one of the over etch condition, the just etch condition and the soft etch condition.

The filling member 180 may increase adhesion between the bending windows 513a and 513b of the cover window 510 and the bending display portions BDP1 and BDP2 of the flexible display panel 130 and/or avoid an adhesive defect by removing a step difference between the bending display portions BDP1 and BDP2 of the flexible display panel 130 and the glass substrate 110. For example, the flexible display panel 130 may be attached to the rear surface of the cover window 510 by a direct bonding process using the module bonding member 520. In this case, if there is no filling member 180, it may be difficult to attach the bending display portions BDP1 and BDP2 of the flexible display panel 130 to the bending windows 513a and 513b of the cover window 510 due to a step difference between the bending display portions BDP1 and BDP2 of the flexible display panel 130 and the glass substrate 110, and an attachment defect may occur between the bending display portions BDP1 and BDP2 of the flexible display panel 130 and the bending windows 513a and 513b of the cover window 510. On the other hand, if the filling member 180 is present, the bending display portions BDP1 and BDP2 of the flexible display panel 130 may be easily attached to the bending windows 513a and 513b of the cover window 510, because a step difference between the bending display portions BDP1 and BDP2 of the flexible display panel 130 and the glass substrate 110 is removed.

The radiation member 170 of the display module 530 may be attached to the rear surface of the glass substrate 110 and the rear surface of the filling member 180 to cover the rear surface of the glass substrate 110 and the rear surface of the filling member 180. For example, the radiation member 170 may be attached to the rear surface of the rear surface of the glass substrate 110 and the rear surface of the filling member 180 by a laminating process using a roller after the flexible display panel 130 including the glass substrate 110 is attached to the rear surface of the cover window 510. In this case, the edge portion of the radiation member 170 overlapped with the filling member 180 may be bent to have a curved shape corresponding to the curved shape of the filling member 180.

As described above, the electronic device according to this embodiment includes the display module 530 provided as the display apparatus 20 shown in FIGS. 6 and 7, whereby the effect of the display apparatus 20 shown in FIGS. 6 and 7 may be obtained. Also, the electronic device according to this embodiment may have the same radiation effect as that of the electronic device shown in FIGS. 19 to 21, and the adhesion between the bending display portions BDP1 and BDP2 of the flexible display panel 130 and the bending windows 513a and 513b of the cover window 510 may be increased as the step difference between the bending display portions BDP1 and BDP2 of the flexible display panel 130 and the glass substrate 110 is removed by the filling member 180.

Figure 23:
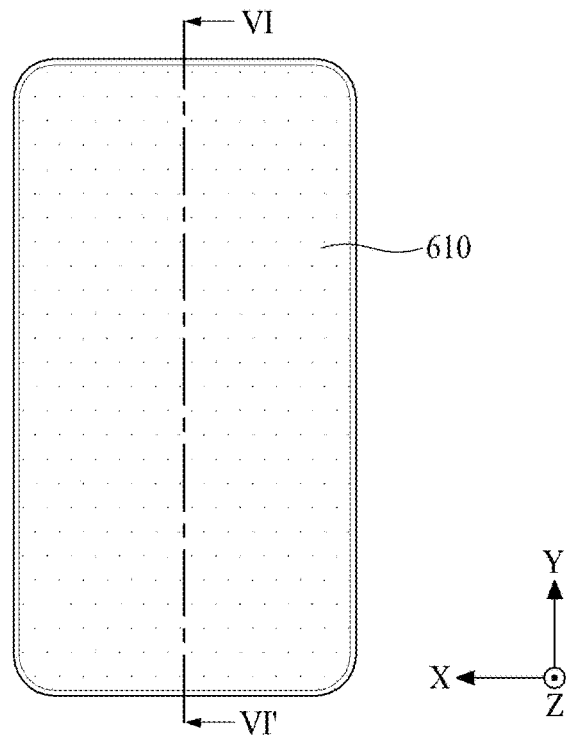
FIG. 23 is a plane view illustrating an electronic device according to another embodiment of the present disclosure.
Figure 24:
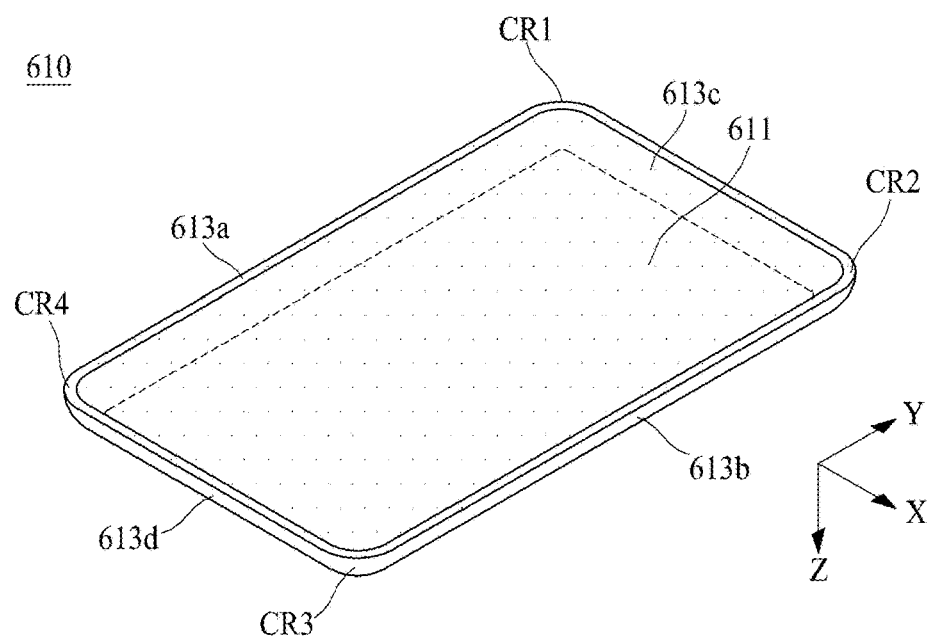
FIG. 24 is a rear view illustrating a cover window shown in FIG. 23.
Figure 25:
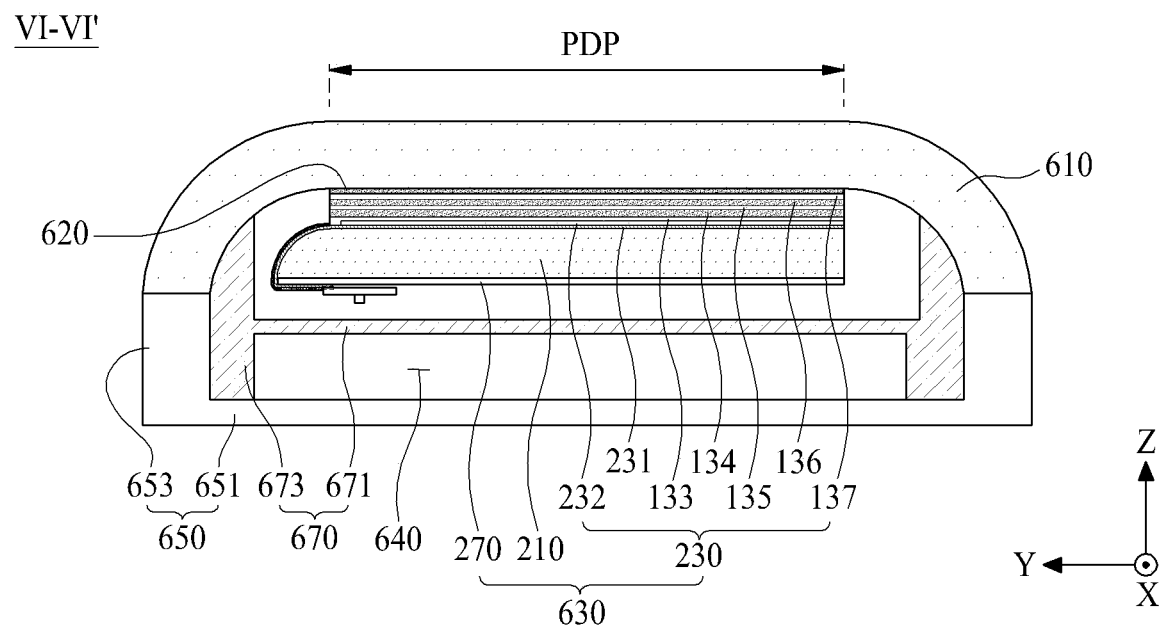
FIG. 25 is a cross-sectional view taken along line VI-VI' shown in FIG. 23.

FIG. 23 is a plane view illustrating an electronic device according to another embodiment of the present disclosure, FIG. 24 is a rear view illustrating a cover window shown in FIG. 23, and FIG. 25 is a cross-sectional view taken along line VI-VI' shown in FIG. 23.

With reference to FIGS. 23 to 25, the electronic device according to another embodiment of the present disclosure may include a cover window 610, a display module 630, and a housing 650.

The cover window 610 may serve to protect the display module 630 from external impact by covering a front surface and a side of the display module 630. The cover window 610 according to one example may be made of a transparent plastic material, a glass material, or a reinforcing glass material.

The cover window 610 according to one example may include a front window 611, first to fourth bending windows 613a, 613b, 613c and 613d bent from an edge portion of the front window 611 in a curved shape, and first to fourth corner rounding portions CR1, CR2, CR3 and CR4 formed among the first to fourth bending windows 613a, 613b, 613c and 613d in a curved shape.

The front window 611 is a center portion of the cover window 610, and may substantially have a plane shape. The front window 611 may cover the front surface of the display module 630.

Each of the first to fourth bending windows 613a, 613b, 613c and 613d may be bent from the edge portion of the front window 611 to have a predetermined curvature radius. Therefore, the edge portion of the front window 611 may have a bending structure of a curved shape. In this case, each of the first to fourth bending windows 613a, 613b, 613c and 613d may surround each side of the display module 630.

The first and second bending windows 613a and 613b may be arranged in parallel with each other along a long side length direction Y of the cover window 610. The first and second bending windows 613a and 613b may be bent to have the same curvature radius or their respective curvature radiuses different from each other. In this case, the first bending window 613a may surround a first side of the display module 630, and the second bending window 613b may surround a second side parallel with the first side of the display module 630.

The third and fourth bending windows 613c and 613d may be arranged in parallel with each other along a short side length direction X of the cover window 610. The third and fourth bending windows 613c and 613d may be bent to have the same curvature radius or their respective curvature radiuses different from each other. In this case, the third bending window 613c may surround a third side of the display module 630, and the fourth bending window 613d may surround a fourth side parallel with the third side of the display module 630.

The first to fourth corner rounding portions CR1, CR2, CR3 and CR4 may respectively be formed between the respective bending windows 613a, 613b, 613c and 613d adjacent to one another in a curved shape.

The cover window 610 may have a four-sided bending structure in which the other edge portions except the center portion are curved, whereby an aesthetic sense of the electronic device may be improved, and a bezel width in each of a horizontal direction and a vertical direction of the electronic device may be reduced.

The display module 630 may be coupled with the rear surface (or back surface) of the cover window 610 to display an image or sense a user's touch. The display module 630 may be bonded to the rear surface of the front window 611 of the cover window 610 through a direct bonding process using a module bonding member 620. In this case, the module bonding member 620 may be a pressure sensitive adhesive (PSA), an optically clear adhesive (OCA), or an optically clear resin (OCR).

The display module 630 according to one example may include a glass substrate 210, a flexible display panel 230, a panel driving circuit portion 150, and a radiation member 270. Because the display module 630 including these elements is substantially the same as the display apparatus 30 shown in FIGS. 8 to 10, the same reference numerals are given to the elements and their repeated description will be omitted.

The display module 630 may be bonded to the rear surface of the front window 611 of the cover window 610 by the module bonding member 620. In this case, the module bonding member 620 may be interposed between the functional film 137 of the display module 630 and the rear surface of the front window 611 of the cover window 610.

In the flexible display panel 230, the plane display portion PDP may be overlapped with the front window 611 of the cover window 610, and the bending portion BP may be overlapped with the third bending window 613c of the cover window 610.

The housing 650 stores the display module 630 and supports the cover window 610. The housing 650 according to one example may include a rear cover 651 covering the rear surface of the display module 630 by interposing a circuit storage space 640 between the display module 630 and the rear cover 651, and a side cover 653 supporting the cover window 610.

The rear cover 651 is arranged on a rear surface at the outermost of the electronic device, and may include a plastic material, a metal material, or a glass material. For example, the rear cover 651 may include a glass material having a color coating layer.

The side cover 653 according to one example is arranged on a side at the outermost of the electronic device, and may be bent from an edge portion of the rear cover 651 and therefore coupled with the first to fourth bending windows 613a, 613b, 613c and 613d of the cover windows 610.

The side cover 653 according to another example is formed of a plastic material, a metal material, or a glass material, and may be arranged between the first to fourth bending windows 613a, 613b, 613c and 613d of the cover windows 610 and the edge portion of the rear cover 651.

The circuit storage space 640 may be provided between the rear surface of the display module 630 and the rear cover 651, and stores a host driving circuit, a memory, a battery, etc. therein.

The electronic device according to one embodiment of the present disclosure may further include a middle frame 670. The middle frame 670 may be arranged in the circuit storage space 640 of the housing 650 to support circuit parts arranged in the circuit storage space 640. Furthermore, The middle frame 670 may support the cover window 610. The middle frame 670 according to one example may include a middle plate 671 and a middle sidewall 673.

The middle plate 671 may be arranged between the rear surface of the display module 630 and the rear cover 651 to support circuit parts arranged in the circuit storage space 640.

The middle sidewall 673 may vertically be coupled with a side of the middle plate 671 to support the first to fourth bending windows 613a, 613b, 613c and 613d of the cover windows 610. Optionally, the side cover 653 of the housing 650 may be replaced with the middle sidewall 673 of the middle frame 670. In this case, the middle sidewall 673 of the middle frame 670 may be arranged between the first to fourth bending windows 613a, 613b, 613c and 613d of the cover windows 610 and the edge portion of the rear cover 651 of the housing 650, whereby the side cover 653 of the housing 650 may be omitted.

The electronic device according to another embodiment of the present disclosure includes the display module 630 provided as the display apparatus 30 shown in FIGS. 8 to 10, whereby the effect of the display apparatus 30 shown in FIGS. 8 to 10 may be obtained, and the same effect as that of the electronic device shown in FIGS. 19 to 21 may be obtained.

Meanwhile, in the electronic device according to another embodiment of the present disclosure, the display module 630 may be modified to any one of the display apparatus 10 shown in FIGS. 1 to 3, the display apparatus 20 shown in FIGS. 6 and 7, the display apparatus 40 shown in FIGS. 11 to 13, the display apparatus 50 shown in FIGS. 14 and 15, the display apparatus 60 shown in FIG. 16, and the display apparatus 70 shown in FIGS. 17 and 18, and its repeated description will be omitted. The display apparatus according to the present disclosure may be, for example, a tablet PC (personal computer), a smart watch, a watch phone, a wearable device, an electronic diary, an electronic book, a PMP(portable multimedia player), a navigator, a television, a notebook computer, or a monitor, without being limited to a smart phone, a mobile communication terminal or a mobile phone.

The flexible display apparatus according to the present disclosure may be described as follows.

The flexible display apparatus according to one embodiment of the present disclosure may comprise a glass substrate including a flat surface and a glass etching surface that is curved; and a flexible display panel including a bending portion on the glass etching surface.

The flexible display panel according to one embodiment of the present disclosure may include a flexible substrate having a plane support portion directly on the flat surface of the glass substrate and a bending support portion bent from the plane support portion in a curved shape and on the glass etching surface of the glass substrate; and a pixel array portion having a plane display portion on the plane support portion and a bending display portion on the bending support portion, wherein the bending portion includes the bending support portion and the bending display portion.

The glass substrate according to one embodiment of the present disclosure may include a first panel support portion having a first glass etching surface on a first edge portion of the glass substrate parallel with a first direction; and a second panel support portion having a second glass etching surface on a second edge portion of the glass substrate parallel with the first edge portion.

The flexible display apparatus according to one embodiment of the present disclosure may further include a flexible substrate having a plane support portion directly on the flat surface of the glass substrate, a first bending support portion on the first panel support portion, and a second bending support portion on the second panel support portion; and a pixel array portion having a plane display portion on the plane support portion, a first bending display portion on the first bending support portion, and a second bending display portion on the second bending support portion.

The flexible display apparatus according to one embodiment of the present disclosure may further include a filling member covering each of the first panel support portion and the second panel support portion, wherein the filling member is bent together with each of the first bending display portion and the second bending display portion.

The flexible display panel according to one embodiment of the present disclosure may further include a pixel array portion on the flat surface of the glass substrate; a display pad portion connected to the pixel array portion; and a link line portion between the pixel array portion and the display pad portion, wherein the bending portion includes the link line portion.

The glass substrate according to one embodiment of the present disclosure may further includes a panel support portion having the glass etching surface formed on a third edge portion overlapped with the link line portion.

The flexible display panel according to one embodiment of the present disclosure may further include a flexible substrate having a plane support portion directly on the flat surface of the glass substrate and a bending support portion bent from the plane support portion in a curved shape and on the glass etching surface; a pixel array portion having a display portion on the plane support portion; a display pad portion connected to the pixel array portion and on the bending support portion; and a link line portion connected between the pixel array portion and the display pad portion and on the bending support portion, wherein the bending portion includes the link line portion.

The flexible display apparatus according to one embodiment of the present disclosure may further comprise an auxiliary glass substrate including an auxiliary flat surface on a third edge portion of the flexible display panel and having the display pad portion and an auxiliary glass etching surface, wherein the link line portion is on the glass etching surface of the glass substrate and the auxiliary glass etching surface of the auxiliary glass substrate in a curved shape.

In the flexible display apparatus according to one embodiment of the present disclosure, a rear surface of the auxiliary glass substrate overlaps a rear edge portion of the glass substrate.

The glass substrate according to one embodiment of the present disclosure may further include a first panel support portion having the glass etching surface on a first edge portion parallel with a first direction; a second panel support portion having the glass etching surface on a second edge portion parallel with the first edge portion; and a third panel support portion having the glass etching surface on a third edge portion parallel with a second direction crossing the first direction.

The flexible display panel according to one embodiment of the present disclosure may further include a plane display portion on the flat surface of the glass substrate; a first bending display portion on the first panel support portion in a curved shape; a second bending display portion on the second panel support portion in a curved shape; and a link line portion on the third panel support portion in a curved shape, wherein the bending portion includes the first bending display portion, the second bending display portion, and the link line portion.

The flexible display apparatus according to one embodiment of the present disclosure may further comprise a filling member covering each of the first panel support portion and the second panel support portion, wherein the filling member is bent together with the first bending display portion and the second bending display portion.

The flexible display apparatus according to one embodiment of the present disclosure may further comprise an auxiliary glass substrate having an auxiliary flat surface and an auxiliary glass etching surface, wherein the flexible display panel further includes: a plane display portion on the flat surface of the glass substrate; a first bending display portion on the first panel support portion in a curved shape; a second bending display portion on the second panel support portion in a curved shape; and a link line portion on the third panel support portion and the glass etching surface of the auxiliary glass substrate in a curved shape, wherein the bending portion includes the first bending display portion, the second bending display portion, and the link line portion.

The flexible display apparatus according to one embodiment of the present disclosure may further comprise a filling member covering each of the first panel support portion and the second panel support portion, wherein the filling member is bent together with each of the first bending display portion and the second bending display portion.

The flexible display panel according to one embodiment of the present disclosure may further include a display pad portion connected with the link line portion, wherein the auxiliary flat surface of the auxiliary glass substrate is coupled with a rear surface of the flexible display panel including the display pad portion; and wherein a rear surface of the auxiliary glass substrate is overlapped with a rear edge portion of the glass substrate.

In the flexible display apparatus according to one embodiment of the present disclosure, the glass etching surface has an inverse tapered shape including an undercut, the undercut being adjacent to a rear surface of the flexible display panel.

In the flexible display apparatus according to one embodiment of the present disclosure, the curved shape of the glass etching surface is tapered.

The flexible display apparatus according to one embodiment of the present disclosure may further comprise a radiation member attached to a rear surface of the glass substrate.

The flexible display apparatus according to one embodiment of the present disclosure may further comprise a radiation member attached to a rear surface of the glass substrate and a rear surface of the filling member.

An electronic device according to one embodiment of the present disclosure may comprise a cover window; and a display module coupled to the cover window, wherein the display module includes a flexible display apparatus comprising a glass substrate including a flat surface and a glass etching surface that is curved; and a flexible display panel including a bending portion on the glass etching surface.

In the electronic device according to one embodiment, the glass etching surface has an inverse tapered shape including an undercut, the undercut being adjacent to the rear surface of the flexible display panel.

In the electronic device according to one embodiment, the curved shape of the glass etching surface is tapered.

In the electronic device according to one embodiment, the flexible display apparatus may further comprise a radiation member attached to a rear surface of the glass substrate.

In the electronic device according to one embodiment, the cover window may include a front window having a plane shape; and a bending window bent from the front window in a curved shape, and surrounding at least one side of the display module.

An electronic device according to one embodiment comprises a cover window having a front window and a bending window bent from the front window in a curved shape; a display module coupled to the cover window; and a housing that stores the display module and supports the cover window, wherein the display module includes: a flexible display panel including a display portion having a plane display portion coupled with the front window and a bending display portion coupled with the bending window; a glass substrate having a flat surface supporting the plane display portion and a glass etching surface supporting the bending display portion; and a filling member supporting the bending display portion and covering the glass etching surface, wherein the glass etching surface has a non-flat structure in which the flat surface is partially removed.

In the electronic device according to one embodiment, the glass etching surface has an inverse tapered shape including an undercut, the undercut being adjacent to a rear surface of the flexible display panel.

The electronic device according to one embodiment further comprises a radiation member on a rear surface of the glass substrate and a rear surface of the filling member, wherein the bending display portion, the filling member, and an edge portion of the radiation member on the rear surface of the filling member are respectively bent along the curved shape of the bending window.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

It will be apparent to those skilled in the art that various modifications and variations can be made in the flexible display apparatus and electronic device comprising the same of the present disclosure without departing from the spirit or scope of the disclosure. Thus, it is intended that the present disclosure cover the modifications and variations of this disclosure provided they come within the scope of the appended claims and their equivalents.

What is claimed is:

1. A flexible display apparatus, comprising:
a glass substrate including a flat surface and a glass etching surface that is curved from which the flat surface is partially removed; and
a flexible display panel including a bending portion on the glass etching surface and a plane display portion on the flat surface of the glass substrate,
wherein the glass etching surface has an inverse tapered shape adjacent to a rear surface of the flexible display panel,
wherein the glass substrate includes a flat rear surface,
wherein at least a portion of the curved glass etching surface is over at least a portion of the flat rear surface,
wherein a thickness of the plane display portion is the same as a thickness of the bending portion,
wherein the flexible display panel further includes:
a pixel array portion on the flat surface of the glass substrate;
a display pad portion connected to the pixel array portion; and
a link line portion between the pixel array portion and the display pad portion, and
wherein the bending portion includes the link line portion.

2. The flexible display apparatus of claim 1, wherein the flexible display panel further includes:
a flexible substrate having a plane support portion directly on the flat surface of the glass substrate and a bending support portion bent from the plane support portion in a curved shape and on the glass etching surface of the glass substrate,
wherein the pixel array portion has the plane display portion on the plane support portion and a bending display portion on the bending support portion, and
wherein the bending portion includes the bending support portion and the bending display portion.

3. The flexible display apparatus of claim 1, wherein the glass substrate further includes:
a first panel support portion having a first glass etching surface on a first edge portion of the glass substrate parallel with a first direction; and
a second panel support portion having a second glass etching surface on a second edge portion of the glass substrate parallel with the first edge portion.

4. The flexible display apparatus of claim 3, wherein the flexible display panel further includes:
a flexible substrate having a plane support portion directly on the flat surface of the glass substrate, a first bending support portion on the first panel support portion, and a second bending support portion on the second panel support portion,
wherein the pixel array portion has the plane display portion on the plane support portion, a first bending display portion on the first bending support portion, and a second bending display portion on the second bending support portion.

5. The flexible display apparatus of claim 4, further comprising:
a filling member covering each of the first panel support portion and the second panel support portion,
wherein the filling member is bent together with each of the first bending display portion and the second bending display portion.

6. The flexible display apparatus of claim 5, further comprising a radiation member attached to a rear surface of the glass substrate and a rear surface of the filling member.

7. The flexible display apparatus of claim 1, wherein the glass substrate further includes a panel support portion having the glass etching surface formed on a third edge portion overlapped with the link line portion.

8. The flexible display apparatus of claim 1, wherein the flexible display panel further includes:
a flexible substrate having a plane support portion directly on the flat surface of the glass substrate and a bending support portion bent from the plane support portion in a curved shape and on the glass etching surface,
wherein the pixel array portion has a display portion on the plane support portion,
wherein the display pad portion is connected to the pixel array portion and on the bending support portion, and
wherein the link line portion is connected between the pixel array portion and the display pad portion and on the bending support portion.

9. The flexible display apparatus of claim 8, further comprising:
an auxiliary glass substrate including an auxiliary flat surface on a third edge portion of the flexible display panel and having the display pad portion and an auxiliary glass etching surface,
wherein the link line portion is on the glass etching surface of the glass substrate and the auxiliary glass etching surface of the auxiliary glass substrate in a curved shape.

10. The flexible display apparatus of claim 9, wherein a rear surface of the auxiliary glass substrate overlaps a rear edge portion of the glass substrate.

11. The flexible display apparatus of claim 1, wherein the glass substrate further includes:
a first panel support portion having the glass etching surface on a first edge portion parallel with a first direction;
a second panel support portion having the glass etching surface on a second edge portion parallel with the first edge portion; and
a third panel support portion having the glass etching surface on a third edge portion parallel with a second direction crossing the first direction.

12. The flexible display apparatus of claim 11, wherein the flexible display panel further includes:
a first bending display portion on the first panel support portion in a curved shape; and
a second bending display portion on the second panel support portion in a curved shape,
wherein the link line portion is on the third panel support portion in a curved shape,
wherein the bending portion includes the first bending display portion, the second bending display portion, and the link line portion.

13. The flexible display apparatus of claim 12, further comprising:
a filling member covering each of the first panel support portion and the second panel support portion,
wherein the filling member is bent together with the first bending display portion and the second bending display portion.

14. The flexible display apparatus of claim 11, further comprising:
an auxiliary glass substrate having an auxiliary flat surface and an auxiliary glass etching surface,
wherein the flexible display panel further includes:
a first bending display portion on the first panel support portion in a curved shape; and
a second bending display portion on the second panel support portion in a curved shape,
wherein the link line portion is on the third panel support portion and the auxiliary glass etching surface of the auxiliary glass substrate in a curved shape,
wherein the bending portion includes the first bending display portion, the second bending display portion, and the link line portion.

15. The flexible display apparatus of claim 14, further comprising:
a filling member covering each of the first panel support portion and the second panel support portion,
wherein the filling member is bent together with each of the first bending display portion and the second bending display portion.

16. The flexible display apparatus of claim 14,
wherein the display pad portion is connected with the link line portion,
wherein the auxiliary flat surface of the auxiliary glass substrate is coupled with a rear surface of the flexible display panel including the display pad portion, and
wherein a rear surface of the auxiliary glass substrate is overlapped with a rear edge portion of the glass substrate.

17. The flexible display apparatus of claim 1, further comprising a radiation member attached to a rear surface of the glass substrate.

18. An electronic device, comprising:
a cover window; and
a display module coupled to the cover window,
wherein the display module includes the flexible display apparatus of claim 1.

19. The electronic device of claim 18, wherein the flexible display apparatus further comprises a radiation member attached to a rear surface of the glass substrate.

20. The electronic device of claim 18, wherein the cover window includes:
a front window having a plane shape; and
a bending window bent from the front window in a curved shape, and surrounding at least one side of the display module.

21. The flexible display apparatus of claim 1, wherein the at least a portion of the flat rear surface is directly below the at least a portion of the curved glass etching surface.

22. The flexible display apparatus of claim 1, wherein a flatness of the flat rear surface extends from a first edge of the glass substrate to a second edge of the glass substrate.

23. The flexible display apparatus of claim 1, wherein:
the flat surface is parallel to the flat rear surface;
the flat surface has a first length; and
the flat rear surface has a second length that is longer than the first length.

24. The flexible display apparatus of claim 23, wherein:
the flat surface is located between a first portion of the curved glass etching surface and a second portion of the curved glass etching surface;
the second portion is laterally displaced from the first portion by the flat surface;
a first end of the first length touches the first portion of the curved glass etching surface;
a second end of the first length touches the second portion of the curved glass etching surface; and
the second length extends from a first edge of the glass substrate to a second edge of the curved glass etching surface.

25. The flexible display apparatus of claim 1, wherein the flat surface and the curved glass etching surface directly contact each other where the flat surface and an axis of the curved glass etching surface are perpendicular to one another.

26. An electronic device, comprising:
- a cover window having a front window and a bending window bent from the front window in a curved shape;
- a display module coupled to the cover window; and
- a housing that stores the display module and supports the cover window,
- wherein the display module includes:
- a flexible display panel including a display portion having a plane display portion coupled with the front window and a bending display portion coupled with the bending window;
- a glass substrate having a flat surface supporting the plane display portion and a glass etching surface supporting the bending display portion; and
- a filling member supporting the bending display portion and covering the glass etching surface,
- wherein the glass etching surface has a non-flat structure in which the flat surface is partially removed.

27. The electronic device of claim 26, wherein the glass etching surface has an inverse tapered shape including an undercut, the undercut being adjacent to a rear surface of the flexible display panel.

28. The electronic device of claim 26, further comprising:
- a radiation member on a rear surface of the glass substrate and a rear surface of the filling member,
- wherein the bending display portion, the filling member, and an edge portion of the radiation member on the rear surface of the filling member are respectively bent along the curved shape of the bending window.

* * * * *